(12) United States Patent
Saito et al.

(10) Patent No.: US 6,824,609 B2
(45) Date of Patent: Nov. 30, 2004

(54) LIQUID PHASE GROWTH METHOD AND LIQUID PHASE GROWTH APPARATUS

(75) Inventors: Tetsuro Saito, Kanagawa (JP); Katsumi Nakagawa, Kyoto (JP); Tatsumi Shoji, Kanagawa (JP); Takehito Yoshino, Nara (JP); Shoji Nishida, Nara (JP); Masaki Mizutani, Nara (JP)

(73) Assignee: Canon Kabushiki Kaisha, Tokyo (JP)

(*) Notice: Subject to any disclaimer, the term of this patent is extended or adjusted under 35 U.S.C. 154(b) by 133 days.

(21) Appl. No.: 10/229,123

(22) Filed: Aug. 28, 2002

(65) Prior Publication Data
US 2003/0060044 A1 Mar. 27, 2003

(30) Foreign Application Priority Data

Aug. 28, 2001 (JP) ........................................ 2001-258058
Mar. 29, 2002 (JP) ........................................ 2002-095998
Aug. 28, 2002 (JP) ........................................ 2002-248500

(51) Int. Cl.$^7$ .......................... C30B 19/00; C30B 35/00
(52) U.S. Cl. .......................... 117/54; 117/204; 117/206; 117/900
(58) Field of Search .......................... 117/54, 204, 206, 117/900

(56) References Cited

U.S. PATENT DOCUMENTS

| 5,603,762 A | 2/1997 | Kokune et al. ............... 117/60 |
| 6,190,937 B1 | 2/2001 | Nakagawa et al. ........... 438/67 |
| 6,258,698 B1 | 7/2001 | Iwasaki et al. ............. 438/455 |

FOREIGN PATENT DOCUMENTS

| EP | 1 201 798 A1 | 5/2002 |
| JP | 55-140793 | 4/1980 |
| JP | 5-3309779 | 12/1993 |
| JP | 6-206792 | 7/1994 |
| JP | 7-277876 | 10/1995 |
| JP | 7-315983 | 12/1995 |
| JP | 10-189924 | 7/1998 |
| JP | 2001-39791 | 2/2001 |

Primary Examiner—Felisa Hiteshew
(74) Attorney, Agent, or Firm—Fitzpatrick, Cella, Harper & Scinto

(57) ABSTRACT

A liquid phase growth method is provided which comprises dipping a seed substrate in a solution in a vessel having a crystal raw material melted therein and growing a crystal on the substrate, wherein a fin is provided on a bottom of the vessel, for regulating a flow of the solution from a central portion outside in a radial direction in the vessel; a flow-regulating plate is provided in the vicinity of an inner sidewall of the vessel, for regulating a flow of the solution from the bottom upwardly; and the vessel is rotated while regulating a flow of the solution by an action of the fin and the flow-regulating plate to bring the solution into contact with the seed substrate. Thus, there is provided a liquid phase growth method and apparatus capable of providing a high growth rate and showing little difference in the growth rate among the substrates or within the same substrate even when a number of substrates are charged in one batch.

27 Claims, 17 Drawing Sheets

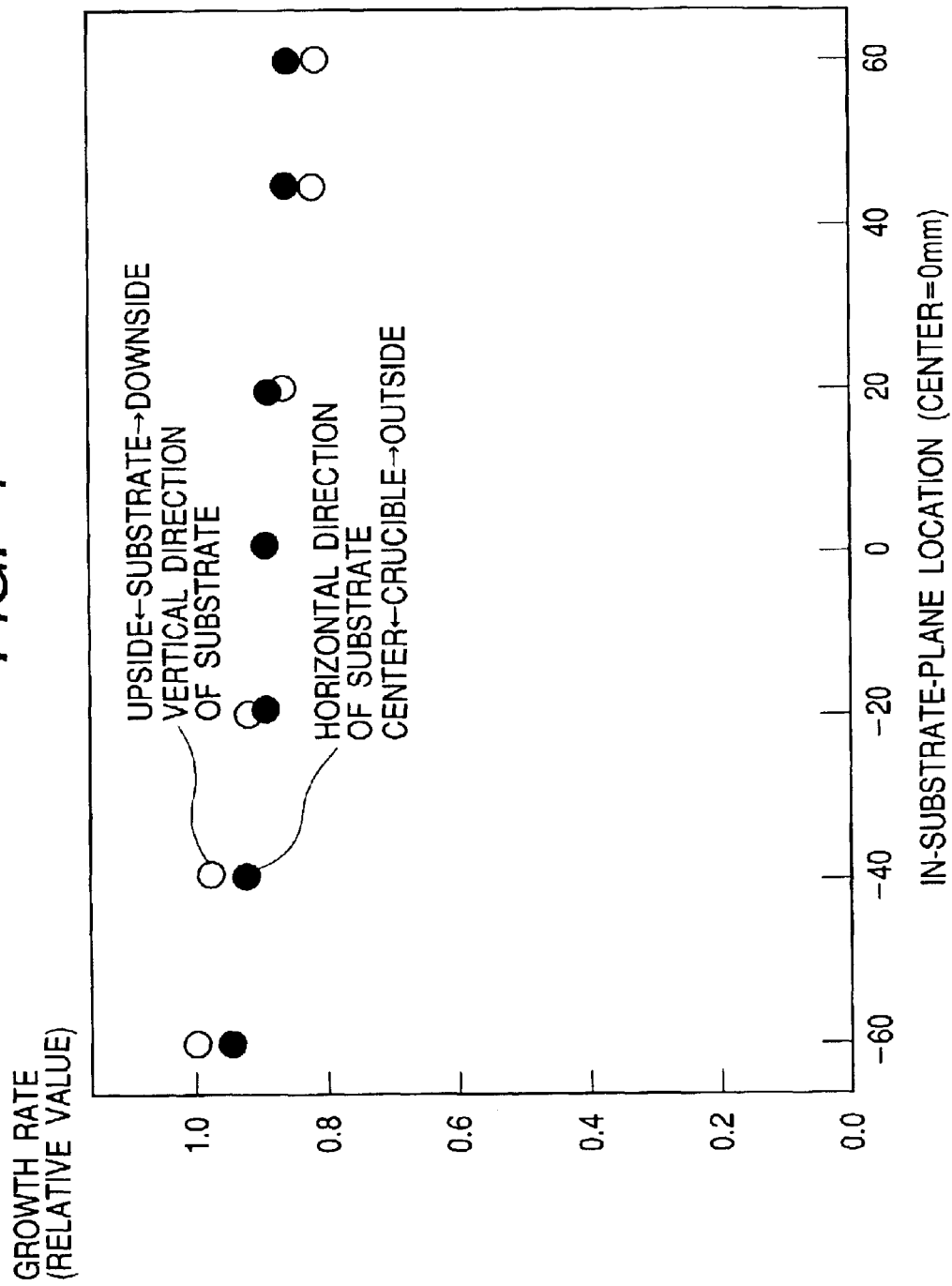

LIQUID PHASE GROWTH METHOD AND LIQUID PHASE GROWTH APPARATUS

BACKGROUND OF THE INVENTION

1. Field of the Invention

The present invention relates to a liquid phase growth method for producing various semiconductor crystals and optical crystals adapted for use in semiconductor devices and electro-optical devices, and a liquid phase growth apparatus suitable for carrying out the method.

2. Related Background Art

Solar cells have become adopted widely for consumer use with the recently increased concern for the environment. Monocrystalline or polycrystalline silicon is principally used as the semiconductor material for the solar cells for consumer use.

At present, such crystals are cut out from a large ingot by slicing in the form of a wafer of a thickness of about 300 $\mu$m. Such a method is insufficient in the utilization efficiency of the material, since a slicing margin of about 200 $\mu$m will be required in the slicing operation. In order to attain a larger production amount and a lower cost hereafter, it is desired to grow and use a crystal of a minimum thickness required electrically or optically of several 10 to about 100 $\mu$m. For growing a crystalline silicon of such a small thickness, there has principally been investigated the gaseous phase growth method in which a silicon-containing gas is decomposed by the action of heat or plasma.

However, in the mass production of solar cells, there is required an apparatus capable of growing silicon at a rate of 1 $\mu$m/min or more on several tens to several hundreds of square substrates of 4 to 5 inches square in a single batch. The gaseous phase growth apparatus that meets such requirement is not commercially available.

For crystal growth, there is also conventionally known the liquid phase growth method, and the method is practically employed in producing compound semiconductor crystals for LEDs and optical crystals for electro-optical elements. Recently, as disclosed in Japanese Patent Application Laid-Open No. 10-189924, there has been reported utilization of a crystalline silicon film grown on a crystalline silicon substrate or a ceramic substrate for the production of the solar cells.

In the liquid phase growth method, a melt is prepared firstly by heating to fuse a metal such as tin, indium or gallium or an oxide such as a lithium oxide or niobium oxide. Then, a material for constituting a crystal such as arsine or silicon is melted in the melt as needed, then a substrate is dipped in the melt and the melt is brought into supersaturation by, for example, cooling to deposit a crystal on the substrate. The liquid phase growth method is not only capable of growing a crystal of good quality but also is less in the waste of a material that does not contribute to the crystal growth as compared with the gaseous phase growth method and is therefore suitable for application to a device such as a solar cell for which a low production cost is strongly required or an electro-optical device using an expensive material such as gallium or niobium.

However, since the liquid phase growth method has been limited in its application, the apparatuses that have been commercially available are limited to those for growing a compound semiconductor on a substrate of 3 inches or less in diameter and have had few applications for silicon growth.

In consideration of the foregoing, the conventional liquid phase growth apparatuses have been studied and found to have the following problems.

FIG. 14 is a schematic view showing an example of the conventional liquid phase growth apparatus capable of crystal growth on a plurality of substrates. In this apparatus, five substrates 201 are horizontally supported at predetermined distances by substrate support means 202, and are immersed in a melt 204 held in a crucible 203 of a cylindrical shape with a bottom, and these components are housed in a growth chamber 205. The temperature of the melt 204 can be suitably controlled by an electric furnace 206. The growth chamber is provided with and can be suitably opened or closed by a gate valve 207.

In this apparatus, firstly, substrates 201' for melting in a melt (represented as "201'" with a prime in order to distinguish them from substrate for crystal growth and hereinafter sometimes referred to simply as "melting substrates") made of a crystal raw material (i.e., material to be grown) such as silicon are supported by the substrate support means 202, and are immersed in a melt of a low-melting metal such as tin, indium or gallium or an oxide such as a lithium oxide or niobium oxide, as heated to a predetermined temperature by the electric furnace 206, to melt the crystal raw material to the saturation state at the temperature, thereby preparing the melt 204. Thereafter, the melting substrates 201' are lifted up from the melt 204 and are replaced by the substrates 201 for crystal growth (hereinafter sometimes referred to simply as "growth substrates"). (Therefore, the growth substrate 201 and the melting substrate 201' cannot be distinguished from each other in the figures.)

Thereafter, when the melt 204 is gradually cooled to a predetermined temperature and the growth substrates 201 are immersed therein, the raw material which is no longer soluble in the melt 204 starts to deposit on the surfaces of the substrates 201, so that crystals such as of silicon will grow on the substrates. At this time, a polycrystalline film is grown when the substrate 201 is made of polycrystalline silicon, glass or ceramic, but a monocrystalline film can be grown when the substrate 201 is made of monocrystalline silicon. The substrates 201 are lifted up when the crystals are grown to a predetermined thickness.

By carrying out the mounting or detaching of the substrates 201 to or from the substrate support means 202 with the gate valve 207 being closed, and by changing the interior of the load lock chamber 208 from the atmosphere to an inert gas or the like and thereafter opening the gate valve 207 and lowering the substrates 201 into the growth chamber 205, the melt 204 can be prevented from reacting with oxygen or water or from being contaminated.

In the apparatus shown in FIG. 14, the number of substrates can be increased as needed. However, it has been experimentally found that the above-described configuration is insufficient for obtaining a high growth rate uniformly over the plane.

FIG. 15 is a chart showing the in-plane distribution of the growth rate in a case where five silicon wafers of a diameter of 5 inches, maintained at a mutual distance of 1 cm, are subjected to silicon crystal growth from an indium melt. In the figure, the symbol "○" indicates the distribution in the substrates positioned close to the surface layer portion of the melt, while "●" indicates that in the substrates positioned close to the bottom of the melt.

Although the difference between the substrates is small, the growth rate at the central portion of each substrate is about ⅓ of that at the peripheral portion, as shown in FIG.

15. Further, decreasing the cooling rate of the melt reduces the ununiformity within the plane but also decreases the entire growth rate. Further, increasing the distance between the substrates reduces the ununiformity but decreases the number of substrates that can be charged in a single batch. Thus, the both means will result in lowering in the throughput.

The ununiformity of the growth rate within the plane results from the fact that a fresh melt cannot be supplemented in a sufficient amount after the crystallization of the semiconductor raw material melted in the melt present between the substrates, and the ununiformity becomes more remarkable as the deposition rate becomes large or the distance between the substrates is made smaller. In the apparatus shown in FIG. 14, by rotating the substrates during the crystal growth, the uniformity of the growth rate is somewhat improved since a melt containing silicon at a high concentration is supplemented between the substrates, but is still insufficient.

For causing mutual movement of the melt and the substrates, there can also be conceived a method of rotating the crucible while maintaining the substrates stationary. Rotation of the crucible kept at a high temperature is already adopted generally in the single crystal pulling up apparatus of the Czochralski method. Japanese Patent Application Laid-Open No. 7-315983 proposes a configuration in which rotation of a crucible is applied to a liquid phase growth apparatus.

However, in a method of merely rotating a crucible, the melt does not sufficiently follow the rotation of the crucible, so that the melt agitating effect is small although the apparatus becomes complicated in its structure.

Further, Japanese Patent Application Laid-Open No. 5-330979 discloses a method of liquid phase growth by arranging substrates vertically and dipping them in a melt. The configuration of this liquid phase growth apparatus is shown in FIG. 16, wherein reference numeral 310 denotes an electric furnace, 303 a crucible, 301 a solution, 312 growth substrates mountable on a supporting rod, 315 a supporting rod, 317 a drive means, 318 a support stand, and 319 a lifter.

As shown in FIG. 16, the growth substrates 312 are supported perpendicularly to the surface of the solution 301, and are dipped in the solution 301 by the lowering of the supporting rod 315 whereby the crystal growth is started. The substrates 312 are rotated with the supporting rod 315 being the center.

The rotation of the substrates in the flat planes thereof reduces the variation of the film thickness among the substrates, but the substrate has to have an opening for mounting on the supporting rod, which portion cannot be used. Further, since the substrate is rotated at a constant location with the center thereof being an axis, the supply of the solution to the substrate surface is limited and the film formation rate cannot be made larger. Furthermore, it is difficult for the conventional arrangement of the substrates to process a number of substrates in a single step.

Further, Japanese Patent Application Laid-Open No. 6-206792 proposes providing baffle plates in a vertical direction on the inner wall of a crucible. However, the proposal has a limited effect in moving the melt from below to above since the baffle plates are provided only on the sidewall. Furthermore, the flow of the solution during the crystal growth is small since the substrates are held horizontally.

Further, Japanese Patent Application Laid-Open No. 7-277876 proposes providing fins on the bottom of a crucible and rotating the crucible, but the flow of a solution in the crucible is insufficient because the fins are provided only at the bottom portion.

Further, Japanese Patent Application Laid-Open Nos. 55-140793 and 2001-39791 propose providing fins at the bottom of a crucible independently from the crucible and rotating the fins to cause a flow of a solution, but the provision of the rotating fins independently from the crucible complicates the structure of the apparatus to increase the production cost thereof. Further, the flow of the solution is insufficient because no vertical fins are present in the vicinity of the wall surface.

SUMMARY OF THE INVENTION

The present invention has been accomplished in consideration of the above-mentioned problems, and an object of the present invention is to provide a liquid phase growth method capable of providing a high growth rate and showing little difference in the growth rate among the substrates or within the same substrate even when a number of substrates are charged in one batch, and an apparatus suitable for carrying out the method.

The above-mentioned object can be attained, according to a first aspect of the present invention, by a liquid phase growth method comprising dipping a seed substrate in a solution (i.e., molten metal) in a vessel having a crystal raw material melted therein and growing a crystal on the substrate, wherein a fin is provided on a bottom of the vessel, for regulating (or directing) a flow of the solution from a central portion outside in a radial direction in the vessel; a flow-regulating plate is provided in the vicinity of an inner sidewall of the vessel, for regulating a flow of the solution from the bottom upwardly; and the vessel is rotated while regulating a flow of the solution by an action of the fin and the flow-regulating plate to bring the solution into contact with the seed substrate.

In the first aspect of the present invention, it is preferred to hold the substrates perpendicularly to a surface of the solution and to arrange the substrates, as viewed from above, radially from a central portion outside in a radial direction in the vessel and equidistantly in a circumferential direction of the vessel.

Further, it is preferred to encircle the substrates with a cylindrical member and to provide a plurality of the flow-regulating plates on an outer peripheral surface of the cylindrical member.

Moreover, it is preferred to provide a cylindrical member at a central portion of the vessel.

Further, it is preferred to rotate the vessel in a circumferential direction thereof, alternately in forward and backward directions.

According to a second aspect of the present invention, there is provided a liquid phase growth apparatus comprising a vessel for housing a solution having a crystal raw material melted therein and substrate support means for supporting and dipping a seed substrate in the solution, wherein a fin is provided on a bottom of the vessel radially in a radial direction thereof; a flow-regulating plate is provided in the vicinity of an inner sidewall of the vessel perpendicularly to a surface of the solution; and the vessel is provided with rotating means.

In the second aspect of the present invention, it is preferred that a plurality of the substrates are supported by the substrate support means perpendicularly to the surface of the solution, and the substrates, as viewed from above, are arranged radially from a central portion outside in a radial direction in the vessel and equidistantly in a circumferential direction of the vessel.

Further, it is preferred that a cylindrical member is provided in the vessel so as to encircle the substrates and the flow-regulating plate is provided vertically on an outer peripheral surface of the cylindrical member.

Moreover, it is preferred that a cylindrical member is provided at a central portion of the vessel such that the substrates are positioned surrounding the member.

Further, it is preferred that an angle formed by a side face of the fin provided on the bottom of the vessel and the bottom face of the vessel becomes a larger obtuse angle toward the outside in the radial direction.

That is, in the first and the second aspects of the present invention, in consideration of the fact that the difference in the crystal growth rate within the same substrate or among substrates results from the decrease of the crystal raw material melted in the solution in the vicinity of the substrate during the growth of the material on the substrate, by sufficiently flowing the solution in the crucible during the growth of the material on the substrate, the decrease of the crystal raw material in the solution in the vicinity of the substrate is effectively prevented.

According to a third aspect of the present invention, there is provided a liquid phase growth method comprising dipping a substrate in a solution housed in a vessel and containing a crystal raw material, and liquid-phase growing the material on the substrate while moving the substrate in a plane direction thereof in the dipped state to agitate the solution.

In the third aspect of the present invention, it is preferred to move the vessel in a direction opposite to the moving direction of the substrate.

Further, it is preferred to arrange the substrates radially and to rotate the substrates to agitate the solution.

According to a fourth aspect of the present invention, there is provided a liquid phase growth apparatus comprising a vessel housing a solution containing a crystal raw material, dipping means for dipping a substrate in the solution, and moving means for moving the substrate in a plane direction thereof in a state in which the substrate is dipped in the solution by the dipping means.

In the fourth aspect of the present invention, it is preferred to further provide means for moving the vessel in a direction opposite to the moving direction of the substrate.

Moreover, it is preferred to further provide substrate support means for supporting the substrates radially and to rotate the substrate support means to agitate the solution.

Further, it is preferred that a rib is provided on an inner face of the vessel and the thickness of the rib decreases in a direction in which the solution as solidified is taken out.

Moreover, it is preferred that ribs are provided on the side face and the bottom face of the vessel.

That is, in the third and the fourth aspects of the present invention, in consideration of the fact that the difference in the crystal growth rate within the same substrate or among substrates results from the decrease of the crystal raw material melted in the solution in the vicinity of the substrate during the growth of the material on the substrate, by sufficiently agitating the solution during the growth of the material on the substrate, the decrease of the crystal raw material in the solution in the vicinity of the substrate is effectively prevented.

According to a fifth aspect of the present invention, there is provided a liquid phase growth method comprising dipping a seed substrate in a solution in a vessel having a crystal raw material melted therein and growing a crystal on the substrate, wherein a first fin is provided on a bottom of the vessel, for regulating a flow of the solution from a central portion outside in a radial direction in the vessel; a second fin is provided on an inner sidewall of the vessel, for regulating a flow of the solution from the bottom upwardly; and the vessel is rotated while regulating a flow of the solution by an action of the first and the second fins to bring the solution into contact with the seed substrate.

In the fifth aspect of the present invention, it is preferred that the crystal is grown on the substrate while moving the substrate in a plane direction thereof to agitate the solution.

Further, it is preferred that the vessel is moved in a direction opposite to the moving direction of the substrate.

Moreover, it is preferred that the substrates are arranged radially and are rotated to agitate the solution.

According to a sixth aspect of the present invention, there is provided a liquid phase growth apparatus comprising a vessel for housing a solution having a crystal raw material melted therein and substrate support means for supporting and dipping a seed substrate in the solution, wherein a first fin is provided on a bottom of the vessel radially in a radial direction thereof and a second fin is provided on an inner sidewall of the vessel.

In the sixth aspect of the present invention, it is preferred that the vessel is provided with rotating means.

Further, it is preferred that the substrate support means is for supporting the substrates radially and is provided with rotating means.

Moreover, it is preferred that a flow-regulating plate is provided in the vicinity of an inner sidewall of the vessel perpendicularly to a surface of the solution.

According to a seventh aspect of the present invention, there is provided a liquid phase growth apparatus comprising a vessel for housing a solution having a crystal raw material melted therein and substrate support means for supporting and dipping a seed substrate in the solution, wherein a flow-regulating plate is provided in the vicinity of an inner sidewall of the vessel perpendicularly to a surface of the solution.

BRIEF DESCRIPTION OF THE DRAWINGS

FIG. 4 is a chart showing the in-plane distribution of the growth rate when using the apparatus shown in FIGS. 3A and 3B;

DETAILED DESCRIPTION OF THE PREFERRED EMBODIMENTS

Now, the present invention will be described in detail with reference to preferred embodiments thereof, to be taken in conjunction with the accompanying drawings, but the present invention is by no means limited by such embodiments.

(Embodiment 1)

Figure 1:
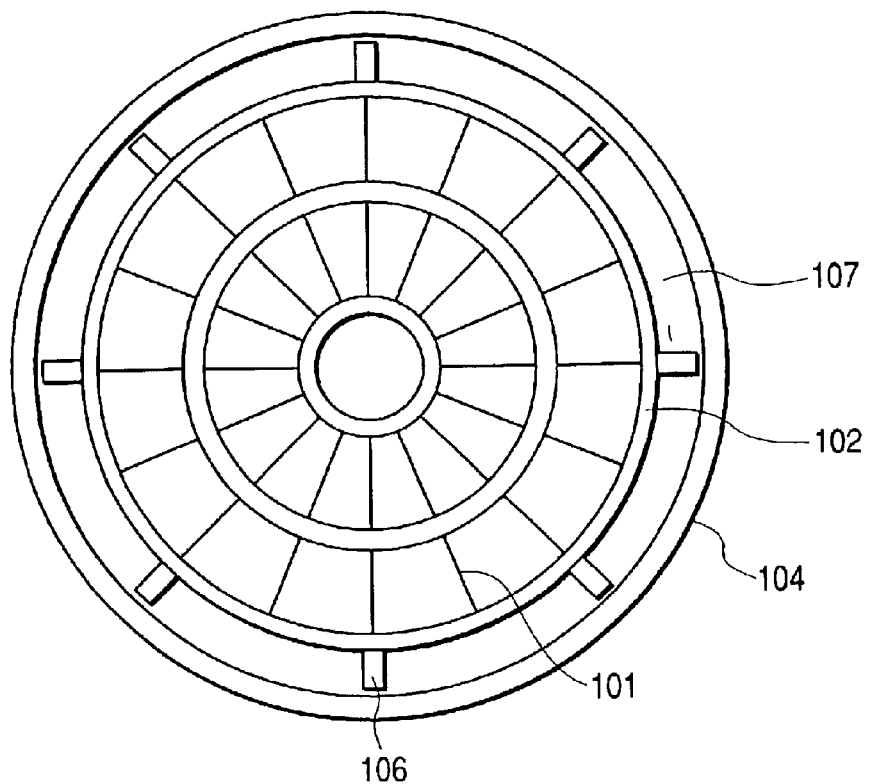
FIG. 1 is a plan view showing the state in a crucible in the liquid phase growth apparatus of a first embodiment of the present invention.
Figure 2:
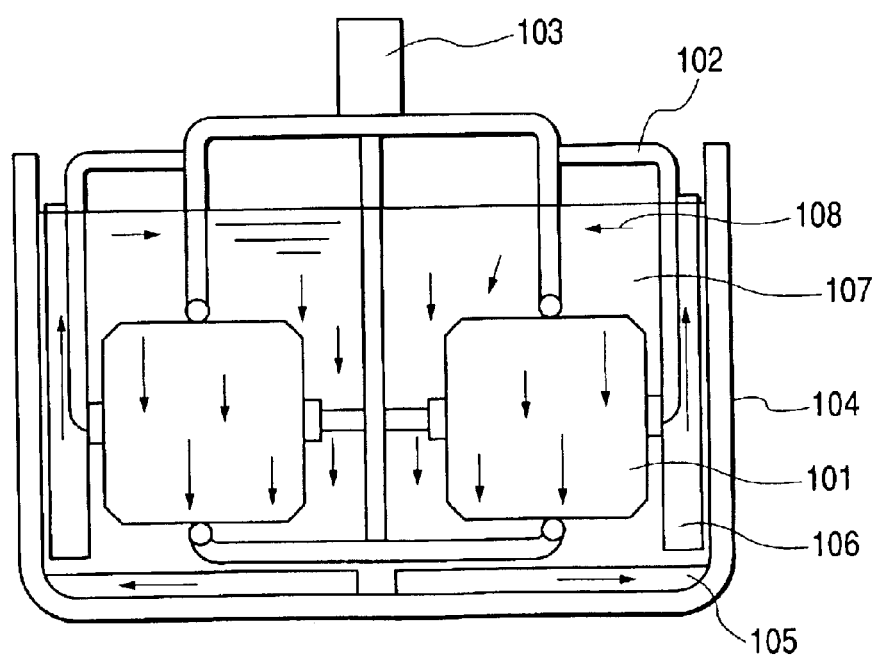
FIG. 2 is a schematic view showing a vertical sectional state of the apparatus shown in FIG. 1.
Figure 3A:
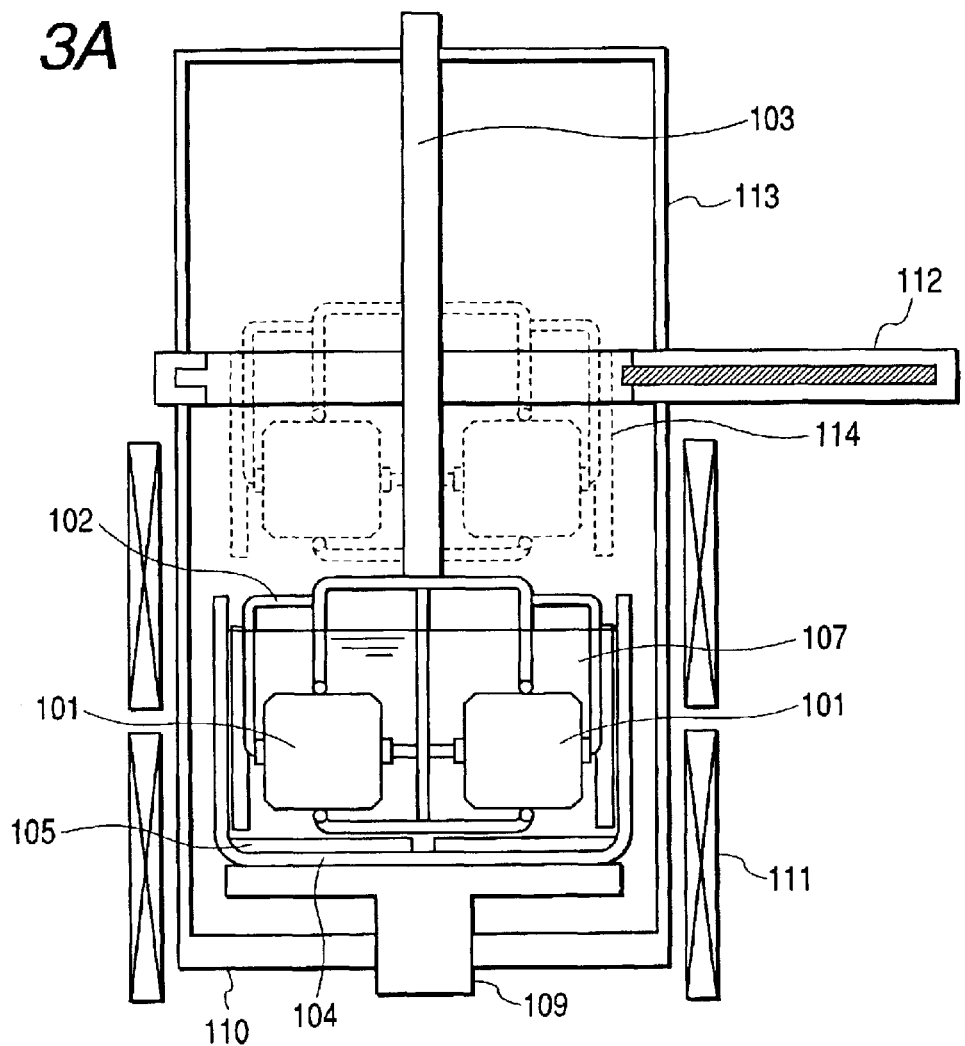
FIGS. 3A and 3B are respectively a schematic view and a horizontal sectional view of a liquid phase growth apparatus of the first embodiment to which the crucible shown in FIGS. 1 and 2 is incorporated.
Figure 3B:
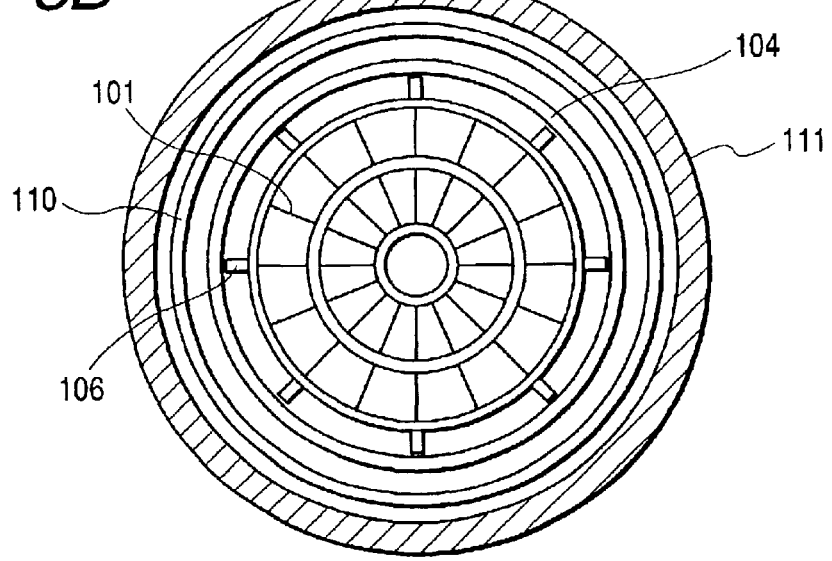

FIG. 1 is a plan view showing the state in a crucible in a liquid phase growth apparatus of Embodiment 1, and FIG. 2 is a schematic view showing the vertical sectional state of the apparatus shown in FIG. 1. Further, FIGS. 3A and 3B are respectively a schematic view and a horizontal sectional view of the liquid phase growth apparatus of Embodiment 1 having incorporated therein the crucible shown in FIGS. 1 and 2. For clarity, the same numerals are employed in FIGS. 3A and 3B as are employed in FIGS. 1 and 2 for equivalent components.

Referring to FIGS. 1 and 2, monocrystalline silicon substrates 101 for growing a silicon layer each has a square shape having sides of 125 mm in length with cut-off corners. There are also provided substrate support means 102 for supporting the substrates 101, and a crucible 104 as a vessel containing a melt 107 therein. Further, reference numeral 105 denotes fins provided radially in the radial direction on the bottom of the crucible 104. Numeral 106 denotes flow-regulating plates 106 provided vertically on the outer periphery of the substrate support means 102, namely in the vicinity of the inner sidewall of the crucible 104, and positioned in plurality at equal intervals (i.e., equidistantly) in the circumferential direction. In the present embodiment, the flow-regulating plates 106 are provided perpendicularly to the liquid surface of the melt 107.

With respect to the arrangement of the substrates 101, 16 substrates 101 are arranged vertically and substantially perpendicularly to the liquid surface of the melt 107, and are supported by the substrate support means 102 so as to be arranged, as shown by the plan view of FIG. 1, radially from the central portion of the crucible 104 to the radially outer portion thereof at equal intervals in the circumferential direction. The mutually adjacent substrates form an angle of about 22.5° and have a distance of about 17 mm at the closest position.

In the melt 107 is melted silicon to be grown on the substrates 101, and 16 substrates 101 are dipped in the melt 107 while being supported by the substrate support means 102.

Further, the crucible 104 is rotated counterclockwise at a speed of 10 rpm as viewed from above as in FIG. 1, whereby the melt 107 forms a flow as indicated by arrows 108 shown in FIG. 2.

Referring to FIGS. 3A and 3B, a support rod 103 for elevating and lowering the substrate support means 102 is provided with a mechanism capable of elevating and lowering motions. A turntable 109 for placing thereon and rotating the crucible 104 in the forward and backward directions is configured in a rotatable fashion by an unrepresented rotation drive mechanism provided therebelow. A growth chamber (growth furnace) 110 is provided with a gate valve 112 at an upper opening, and is capable of maintaining the crucible 104 and the substrates 101 in vacuum atmosphere, hydrogen atmosphere, nitrogen atmosphere, or the like. An electric heating furnace 111 heats the growth chamber 110 and the melt 107 in the crucible 104 housed therein. A load lock chamber 113 is used when supplying the substrates 101 supported by the substrate support means 102 to the growth chamber 110, and is detachably mounted on the gate valve 112.

In the following there will be described the steps of the liquid phase growth method of the present invention carried out using the liquid phase growth apparatus of Embodiment 1.

At first, in an unrepresented substrate exchanging position, 16 pieces of p-type polycrystalline silicon substrates 101' of a square plate shape with sides of 125 mm in length are prepared for silicon melting into the melt 107, then mounted on the substrate support means 102 and are drawn up into the load lock chamber 113 by the supporting rod 103.

On the other hand, the growth chamber 110 is closed by the gate valve 112 at the upper opening and is heated while flowing hydrogen gas therein to 900° C. by the electric heating furnace 111. In this state, the load lock chamber 113 is moved onto the gate valve 112 and is disposed in close contact with the gate valve 112. Then, the interior of the load lock chamber 113 is evacuated, then hydrogen is flown thereinto, and the gate valve 112 is opened.

Subsequently, the substrate support means 102 is gradually lowered to dip the substrates 101' in the melt 107. During this operation, the crucible 104 is rotated counterclockwise at a rate of 6 rpm by the turntable 109. As the radially arranged substrates 101' and the substrate support means 102 provided with the vertical flow-regulating plates 107 are maintained stationary in the rotating crucible 104, the melt 107 is agitated as the crucible 104 rotates. The agitation is continued for 30 minutes and silicon is melted in the melt in a supersaturated state.

Then, after the substrate support means 102 has been lifted up from the melt 107 and housed in the load lock chamber 113, the gate valve 112 between the substrate support means 102 and the load lock chamber 113 is closed.

Then, after the inside atmosphere of the load lock chamber 113 is replaced with nitrogen gas, the load lock chamber 113 is separated from the gate valve 112 and is moved to an unrepresented substrate exchanging position. In this position, the substrates 101' for melting are detached, and 16 pieces of p$^+$-type Cz (Czochralski) silicon substrates 101 for growing, having a square plate shape with sides of 125 mm in length and a face orientation of (100), are prepared and supported on the substrate support means 102.

After the load lock chamber 113 has been again moved onto the gate valve 112 and disposed in close contact with the gate valve 112, the interior of the load lock chamber 113 is evacuated, then hydrogen is flown thereinto, and the gate valve 112 is opened.

Subsequently, the substrate support means 102 is gradually lowered to the substrate heating position 114, and heating is effected by the electric heating furnace 111 to 900° C. At this time, the crucible 104 starts counterclockwise rotation at 10 rpm.

Then, cooling of the melt 107 is started at a cooling rate of −1° C./min. When the melt 107 reaches 895° C., the substrate support means 102 is further lowered to dip the substrates 101 in the melt 107 which is super-saturated with silicon, and the cooling of the melt 107 is further continued.

After continuation of the rotation of the crucible 104 for 30 minutes, the substrate support means 114 is lifted up again to the substrate heating position 114 and is maintained at the position for 1 minute to eliminate the melt remaining on the substrate surface. Thereafter, it is further lifted up to the interior of the load lock chamber 113 and the gate valve 112 is then closed.

After the interior atmosphere of the load lock chamber 113 is replaced with nitrogen, it is moved to the unrepresented substrate exchanging position, and the growth substrates 101 are taken off. The substrates 101 each bear an epitaxially grown silicon layer, the thicknesses of which are determined to have a distribution of 30 μm±10% for in-plane average value among 16 substrates and a distribution of ±10% in an area other than an area within 5 mm from the edge in each substrate.

FIG. 4 is a chart showing the in-plane distribution of the growth rate in case of employing the liquid phase growth apparatus shown in FIGS. 3A and 3B, wherein "○" indicates the distribution at the central portion of the substrate, measured in the vertical direction of the substrate, while "●" indicates the distribution at the central portion of the substrate, measured in the horizontal direction of the substrate.

As is seen from the figure, the silicon layer is deposited thicker at the upper portion of the substrate corresponding to the upper part of the melt, and when comparing the crucible-center-side portion and the crucible-periphery-side portion of the substrate, the silicon layer is deposited thicker at the crucible-center-side portion of the substrate.

Figure 5:
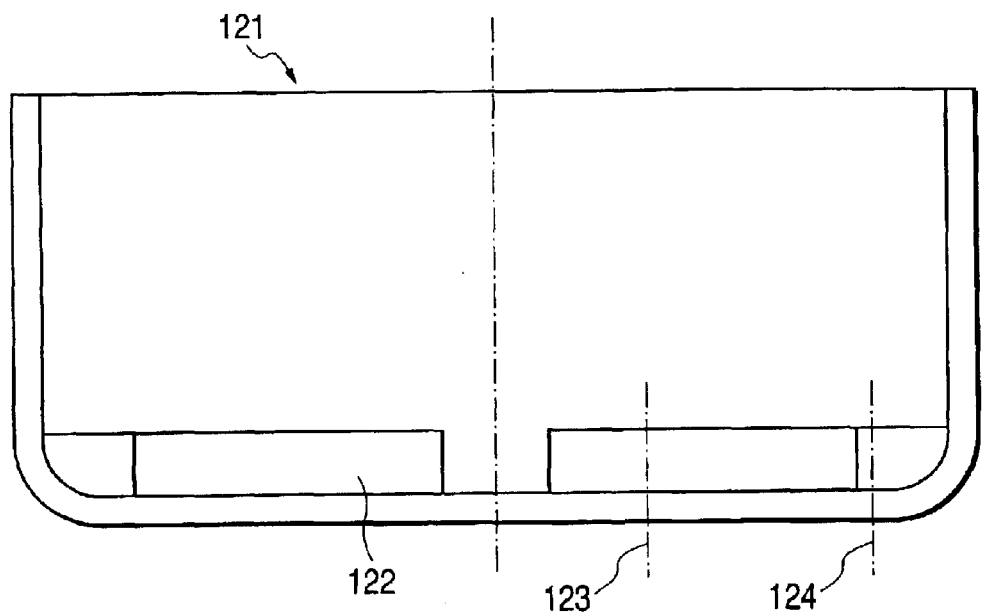
FIG. 5 is a schematic view showing the vertical sectional structure of the crucible of the first embodiment.
Figure 6:
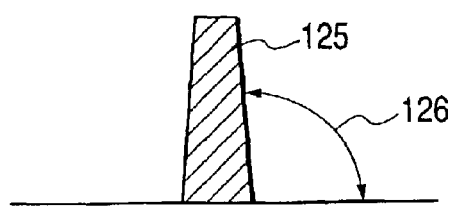
FIG. 6 is a sectional view showing the sectional shape of a fin along line 123 in FIG. 5.
Figure 7:
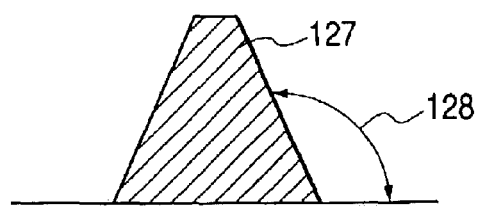
FIG. 7 is a sectional view showing the sectional shape of a fin along line 124 in FIG. 5.

FIG. 5 is a schematic view showing a vertical sectional structure of the crucible of Embodiment 1. In FIG. 5, there are shown a main body 121 of the crucible and radial fins 122 provided at the bottom of the crucible. FIGS. 6 and 7 show sectional shapes of the fin taken along lines 123 and 124 in FIG. 5, respectively. As will be apparent from FIGS. 6 and 7, an angle 126 formed by a side face portion 125 of the fin and the bottom face of the crucible at the portion close to the center of the crucible is approximately a right angle, but an angle 128 formed by a side face portion 127 of the fin and the bottom face of the crucible at the portion close to the periphery of the crucible is a considerably large obtuse angle. Stated differently, the fins 122 are provided at the bottom of the crucible such that the angle between the side face of the fin and the bottom face of the crucible is an obtuse angle which becomes larger toward the outside in the radial direction of the crucible.

This is because the portion 125 of the fin close to the center of the crucible serves to push the melt from the center of the crucible toward the outside portion thereof while the portion 127 of the fin close to the periphery of the crucible serves to push the melt upwardly.

Further, the sectional shape of the fin is made symmetrical in the horizontal direction in order to achieve the above-described effect of causing the flow of the melt, regardless of whether the crucible is rotated in the clockwise or counterclockwise direction.

The difference in the growth rate of the silicon layer between substrates or within the same substrate is considered to depend on whether the solute, which is melted in the melt and becoming deficient by deposition onto the substrate, can be supplemented sufficiently or not. It is therefore possible to reduce the difference in the growth rate between substrates or within the same substrate by causing a sufficient flow of the melt during the crystal growth, thereby inducing a relative movement between the substrates and the melt.

According to the present invention, therefore, fins are provided in the horizontal direction (or laterally) on the bottom of the crucible and the crucible is rotated to induce a flow of the melt, and the flow of the melt on the substrate surface is made uniform by the unique arrangement of the radial fins provided on the bottom of the vessel, the flow-regulating plates provided vertically in the vicinity of the inner sidewall of the vessel and the substrates supported vertically by the substrate support means and arranged radially in the radial direction at equal intervals (i.e., equidistantly) in the circumferential direction.

More specifically, radial fins are provided on the bottom of the crucible containing a solution (melt) which contains silicon to be grown, and flow-regulating plates perpendicular to the melt surface are provided and fixed vertically in the vicinity of the inner sidewall of the crucible. As the crucible is rotated by the turntable, the fins on the bottom of the crucible are rotated relatively thereto and the melt moving by the centrifugal force from the central portion of the crucible to the radially outside portion is guided upwardly by the flow-regulating plates. The melt thus guided upwardly moves toward the central portion of the crucible in the vicinity of the liquid surface, and is regulated and moves again toward the bottom through the gaps between the substrates which are supported perpendicularly to the liquid surface by the substrate support means. Through these operations, the melt being in contact with the substrate surface is constantly refreshed to maintain a high film formation rate.

(Embodiment 2)

In the following there will be explained the liquid phase growth apparatus of Embodiment 2 with reference to FIGS. 8 and 9, which are respectively a plan view showing the state in the crucible of the liquid phase growth apparatus of Embodiment 2 and a schematic view showing the vertical sectional state of the apparatus shown in FIG. 8.

The liquid phase growth apparatus of Embodiment 2 is similar to that of Embodiment 1, but the crucible is formed deeper to accommodate the substrates in two levels in the vertical direction.

Figure 8:
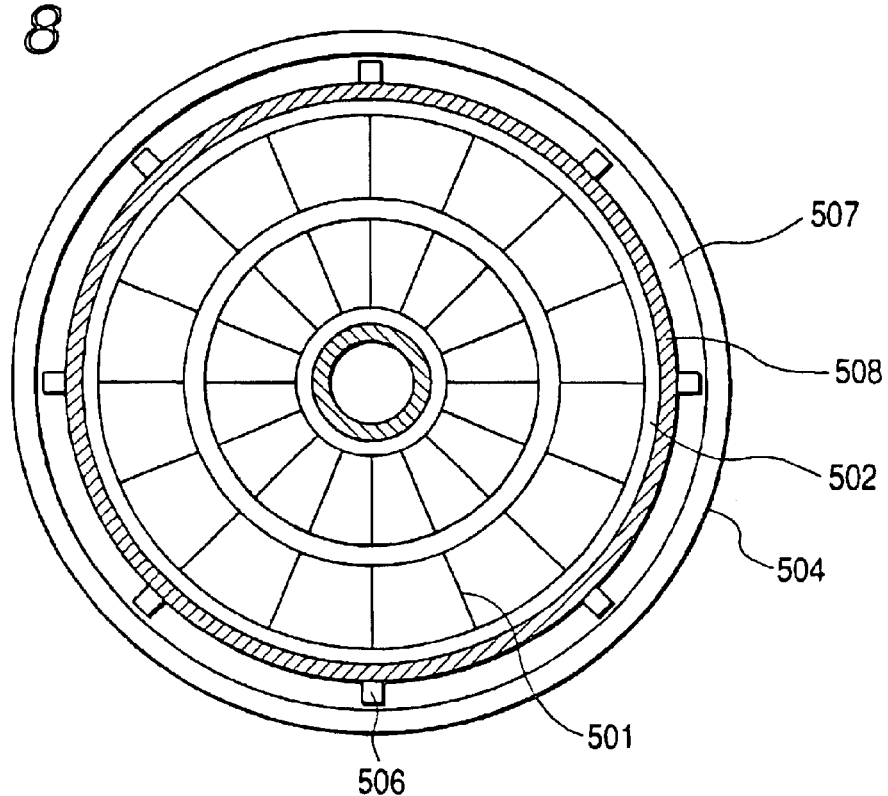
FIG. 8 is a plan view showing the state in a crucible in the liquid phase growth apparatus of a second embodiment.
Figure 9:
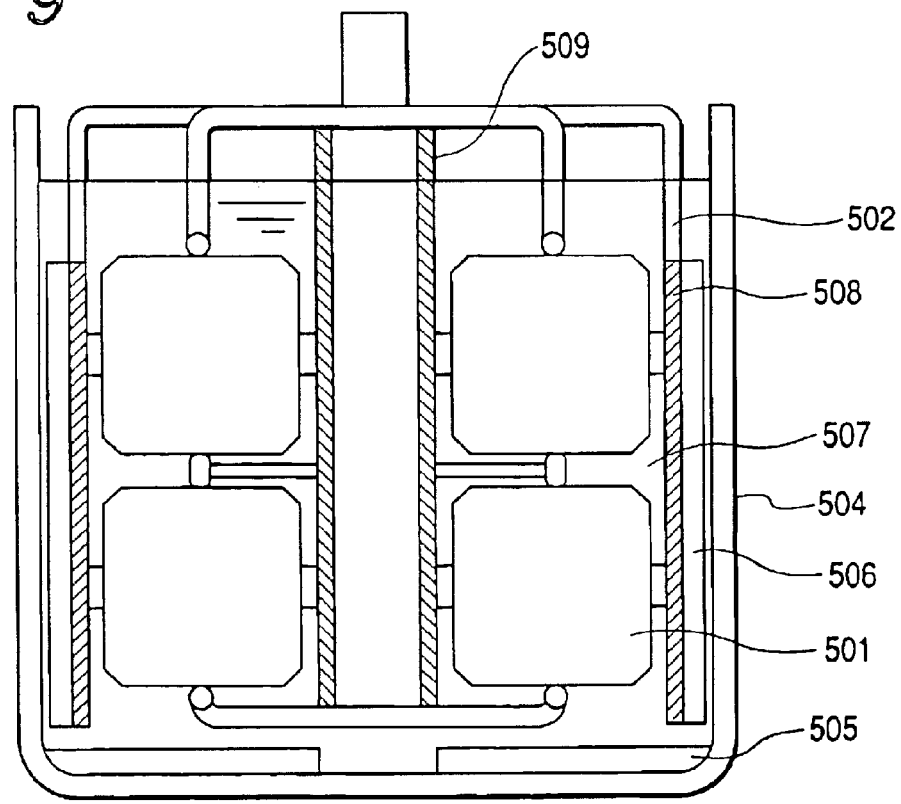
FIG. 9 is a schematic view showing a vertical sectional state of the apparatus shown in FIG. 8.

Referring to FIGS. 8 and 9, there are shown monocrystalline silicon substrates 501 for growing thereon a silicon layer having a square plate shape having sides of 125 mm in length with cut-off corners, substrate support means 502 for supporting the substrates 501, and a crucible 504 containing a melt 507 therein.

There are also provided radial fins 505 provided at the bottom of the crucible 504, a cylindrical member 508 mounted on the outer periphery of the substrate support means 502, and longitudinal flow-regulating plates 506 mounted vertically on the outer peripheral surface of the cylindrical member 508 in the longitudinal direction thereof. Thus, in the crucible 504, the cylindrical member 508 is so provided as to surround the substrates 501, and the flow-regulating plates 508 are provided vertically on the outer peripheral surface of the cylindrical member 508.

A cylindrical member 509, provided at the central portion of the crucible 504 for controlling the flow of the melt 507, is mounted in the central portion of the substrate support means 502 in such a manner that the substrates are positioned surrounding the cylindrical member 509.

With respect to the arrangement of the substrates 501, 16 pieces of substrates 501 are arranged substantially perpendicular to the liquid surface of the melt 507 as in Embodiment 1 and, as shown in the plan view of FIG. 8, are supported by the substrate support means 102 so as to be arranged radially and in two levels in the vertical direction. The mutually adjacent substrates form an angle of about 22.5° and have a distance of about 17 mm at the closest position. The melt 507 housed in the crucible 504 has melted therein silicon to be grown on the substrate 501.

The crucible shown in FIGS. 8 and 9 is incorporated in a liquid phase growth apparatus similar to that shown in FIGS. 3A and 3B to constitute an actual liquid phase growth apparatus. It is different from that of Embodiment 1 in that the substrates 501 are arranged in two levels in the vertical direction, and that a flow control plate consisting of the cylindrical member 508 and the vertical flow-regulating plates 508 is provided in the vicinity of the inner sidewall of the crucible 504 and a cylindrical member 509 also for controlling the flow is provided at the central portion of the crucible 504.

This liquid phase growth apparatus was used to epitaxially grow a silicon layer on each substrate 501 in a liquid phase growth method having steps similar to those of Embodiment 1. In Embodiment 2, the outer cylindrical member 508 is designed so as to be detachable in order not to hinder the mounting of the substrates 501.

After the series of growth steps, the substrates 501 were taken off and were subjected to the evaluation of the silicon layers. The silicon layers epitaxially grown on the substrates 501 were determined for their thicknesses and found to have a thickness distribution of 30 $\mu m \pm 11\%$ as in-plane average value for the 32 substrates and a distribution of ±12% in an area other than an area within 5 mm from the edge in each substrate.

(Embodiment 3)

In the following there will be explained a liquid phase growth apparatus of Embodiment 3 with reference to FIGS. 10 and 11, which are respectively a plan view showing the state in the crucible of the liquid phase growth apparatus of Embodiment 3 and a schematic view showing the vertical sectional state of the apparatus shown in FIG. 10.

The liquid phase growth apparatus of Embodiment 3 is similar to that of Embodiment 1, but the substrates are arranged substantially perpendicularly to the liquid surface of the melt and parallel to each other.

Figure 10:
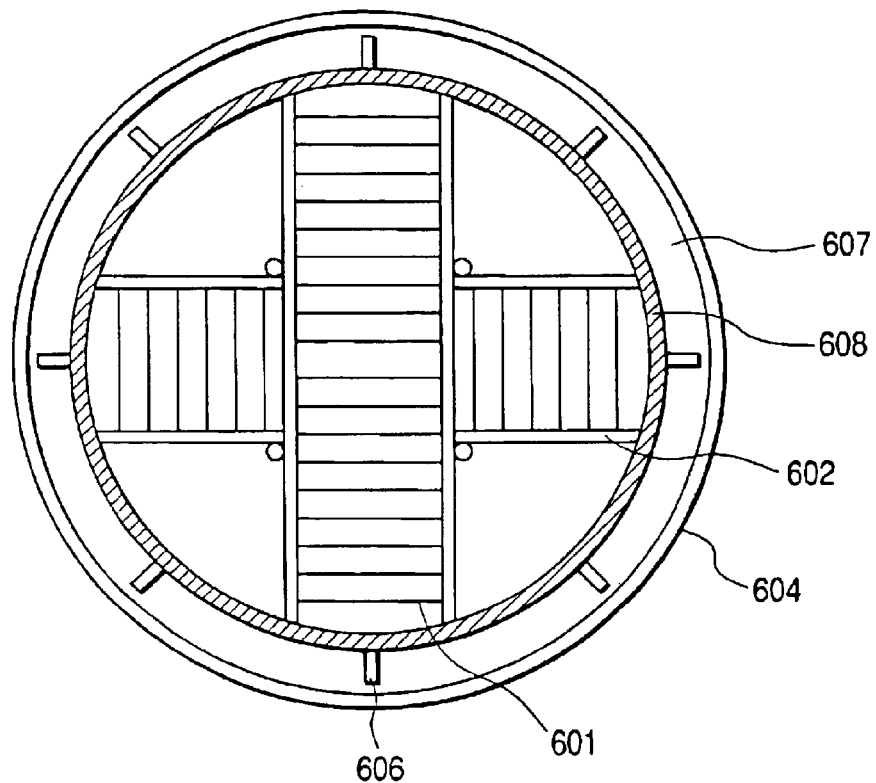
FIG. 10 is a plan view showing the state in a crucible in the liquid phase growth apparatus of a third embodiment.
Figure 11:
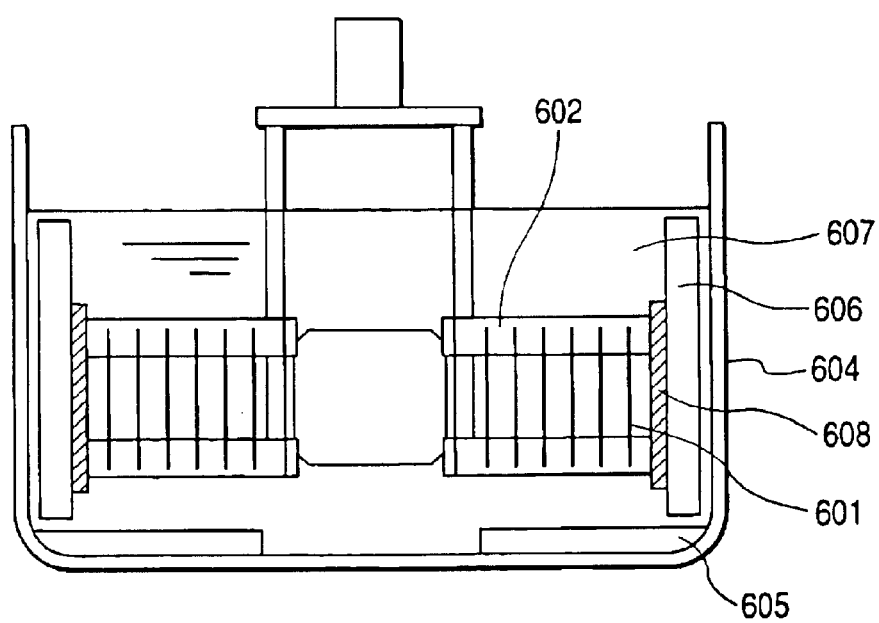
FIG. 11 is a schematic view showing a vertical sectional state of the apparatus shown in FIG. 10.

Referring to FIGS. 10 and 11, there are shown monocrystalline silicon substrates 601 for growing thereon a silicon layer having a square plate shape with sides of 125 mm in length and with cut-off corners, substrate support means 602 for supporting the substrate 601, a crucible 604 containing a melt 607 therein, radial fins 605 provided at the bottom of the crucible 604, a cylindrical member 608 mounted on the outer periphery of the substrate support means 602, and longitudinal flow-regulating plates 606 mounted vertically on the outer peripheral surface of the cylindrical member 608 in the longitudinal direction thereof.

With respect to the arrangement of the substrates 601, the substrates 601 are supported by the substrate support means 602 in such a manner that they are substantially perpendicular to the surface of the melt 607 and, as shown in the plan view of FIG. 10, are parallel to each other at equal intervals. The mutually adjacent substrates have a distance of about 10 mm. The melt 607 housed in the crucible 604 has melted therein silicon to be grown on the substrates 601.

The crucible shown in FIGS. 10 and 11 is incorporated in a liquid phase growth apparatus similar to that shown in FIGS. 3A and 3B to constitute an actual liquid phase growth apparatus. It is different from that of Embodiment 1 in that the substrates are arranged parallel to each other at equal intervals, and that a flow control plate consisting of the cylindrical member 608 and the flow-regulating plates 606 substantially perpendicular to the surface of the melt 607 is provided in the vicinity of the inner sidewall of the crucible 604.

This liquid phase growth apparatus was used to epitaxially grow a silicon layer on each substrate 601 in a liquid phase growth method having steps similar to those of Embodiment 1. In Embodiment 3, the substrate support means 602 is designed so as to be decomposable and can suitably be disassembled at the mounting of the substrates.

After the series of growth steps, the substrates 601 were taken off and were subjected to the evaluation of the silicon layers. The silicon layers epitaxially grown on the substrates 601 were determined for their thicknesses and were found to have a thickness distribution of 30 $\mu m \pm 13\%$ as in-plane average value for the 30 substrates and a distribution of ±15% in an area other than an area within 5 mm from the edge in each substrate.

(Embodiment 4)

The present embodiment shows a case of mass producing thin film monocrystalline silicon solar cells by the liquid phase growth method of the present invention. The process for producing the solar cell is disclosed in detail in Japanese Patent Application Laid-Open No. 10-189924, but will be explained briefly with reference to FIG. 12.

Figure 12:
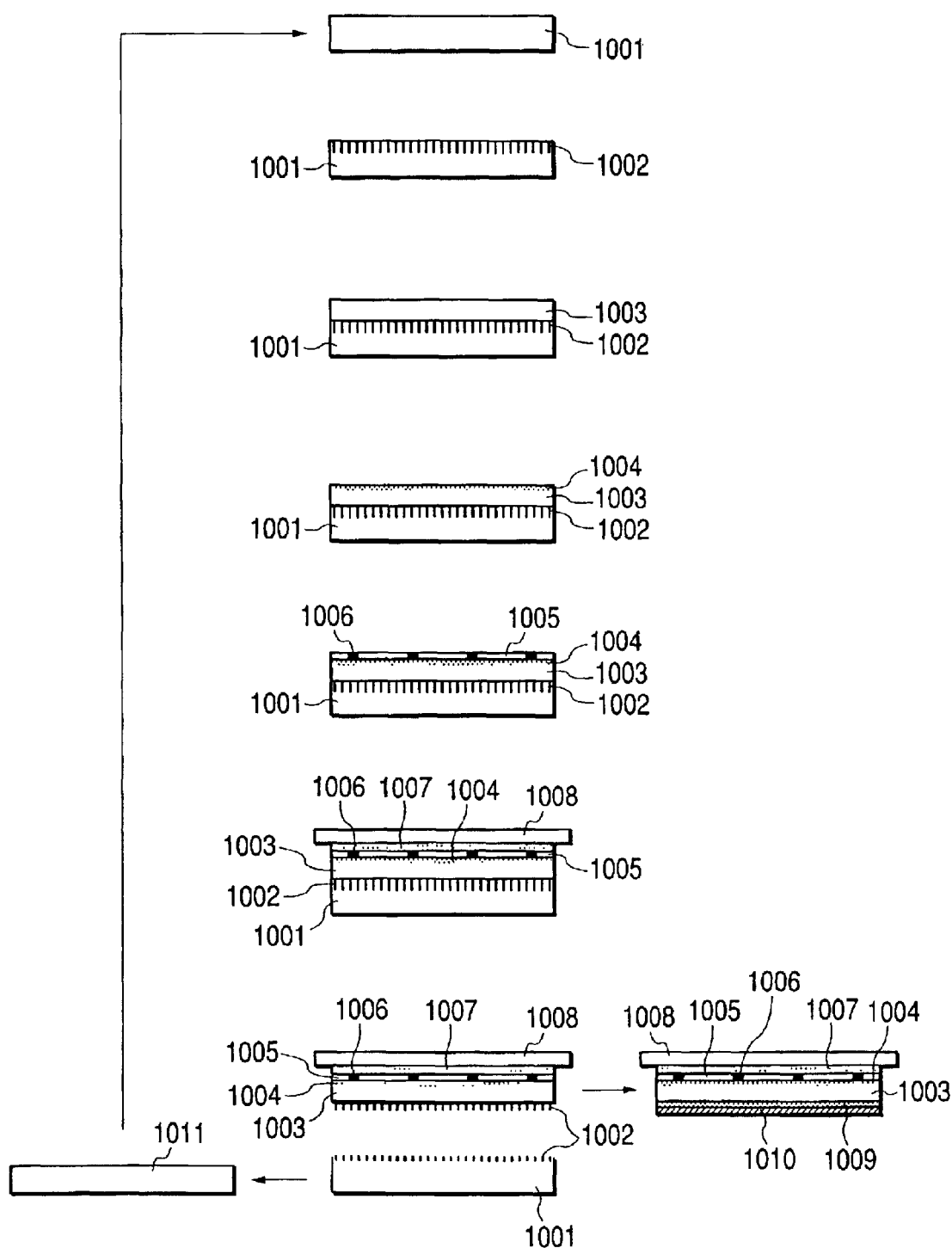
FIG. 12 is a schematic view showing an example of a solar cell producing method of a fourth embodiment of the present invention.

Referring to FIG. 12, a $p^+$-type silicon substrate 1001 has a square plate shape with sides of 125 mm in length and a face orientation of (111). The substrate 1001 is immersed in hydrofluoric acid solution diluted with ethanol and is subjected to anodization under application of a positive voltage. The anodization forms a porous layer 1002 of a thickness of 5 $\mu m$ on the surface of the substrate 1001. The porous layer has formed therein complicatedly entangled fine pores but retains monocrystallinity and allows epitaxial growth thereon.

Prior to the epitaxial growth, the substrate 1001 is subjected to annealing at a temperature of 1050° C. in a hydrogen atmosphere. This causes rearrangement of the atoms in the surface of the porous layer to block the fine pores in the surface, thereby facilitating the subsequent epitaxial growth.

Then, on the porous layer 1002, a p⁻-type layer 1003 of a thickness of 30 µm is grown by the liquid phase growth method. Then, an n⁺-layer 1004 of a thickness of 0.3 µm is grown by the liquid phase growth method in order to form a junction. The details of the liquid phase growth method will be explained separately. However, the n⁺-layer 1004 may also be formed by, for example, thermal diffusion of an impurity.

Then, on the n⁺-layer 1004, a thermal oxide film 1005 is formed as a passivation layer.

Then, as an electrode on the surface side, a silver paste is printed in a comb-shape pattern and then sintered to form a grid electrode 1006. By the sintering, the silver pattern penetrates the thermal oxide film 1005 and comes into contact with the n⁺-layer 1004.

On the thus formed grid electrode 1006, a glass plate 1008 is adhered with an adhesive 1007, and an external force is applied to the glass plate 1008 with the silicon substrate 1001 being fixed, to break the porous layer 1002 which is mechanically weak due to the formation of the fine pores, thereby peeling the portion including the p⁻-type layer 1003 and its overlying layers from the substrate 1001.

The residue of the porous layer 1002 remaining on the rear surface of the thus peeled p⁻-type layer 1003 is removed by etching, and a nickel-plated copper plate 1010 is adhered with a conductive adhesive 1009 thereto.

On the other hand, the residue of the porous layer 1002 remaining on the surface of the remaining substrate 1001 is removed by etching to restore the mirror surface. The substrate 1001 thus regenerated is equivalent to the initial substrate with the exception that the thickness is decreased by about 5 µm and can be repeatedly used by returning it to the first step of the process. In FIG. 12, the porous layer 1002 is illustrated extremely thick, for the sake of explanation.

In the following, there will be explained, with reference to FIG. 13, the configuration of the liquid phase growth apparatus for epitaxial growth of silicon.

Figure 13:
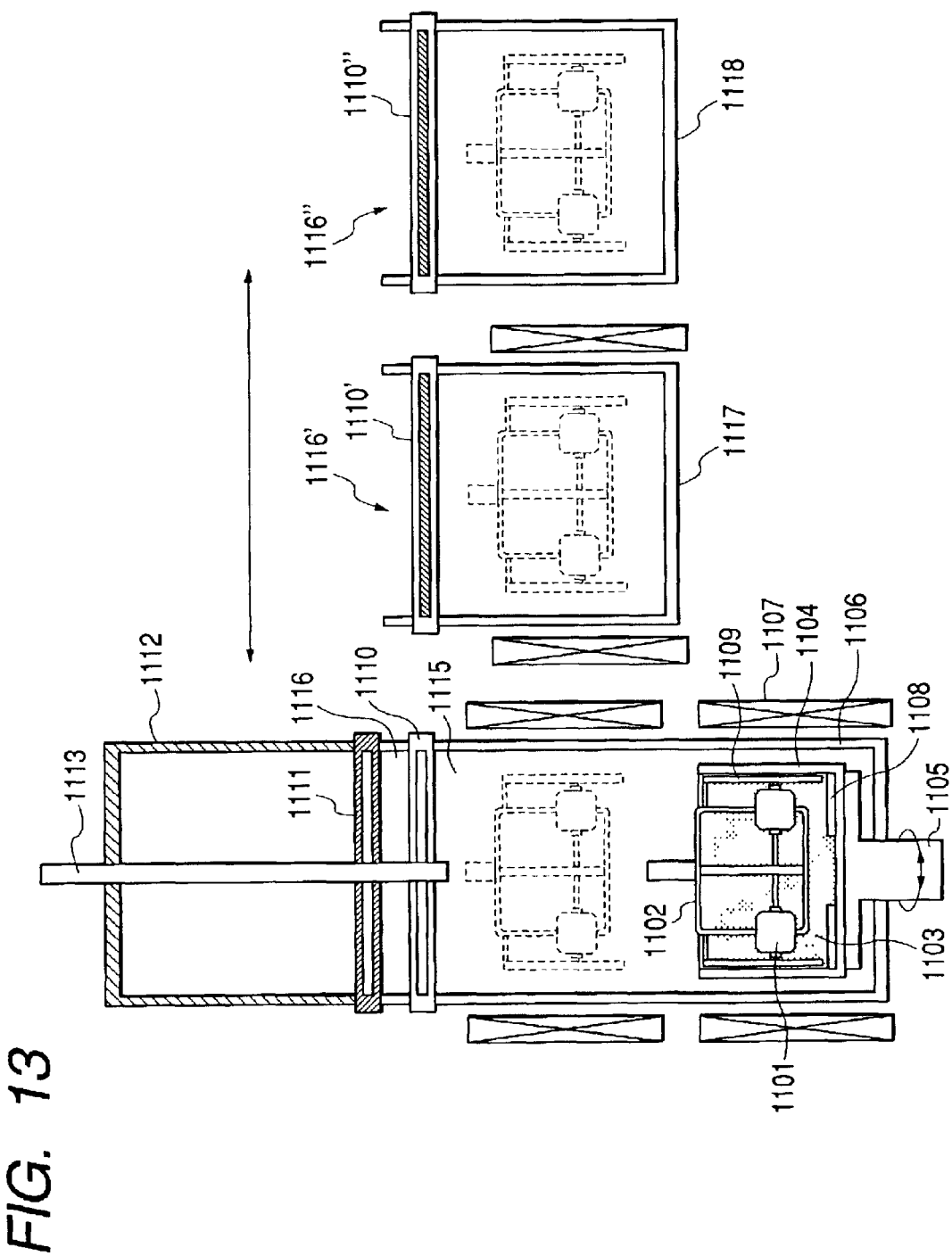
FIG. 13 is a schematic view showing a liquid phase growth apparatus of the present invention, suitable for mass production of solar cells.
Figure 14:
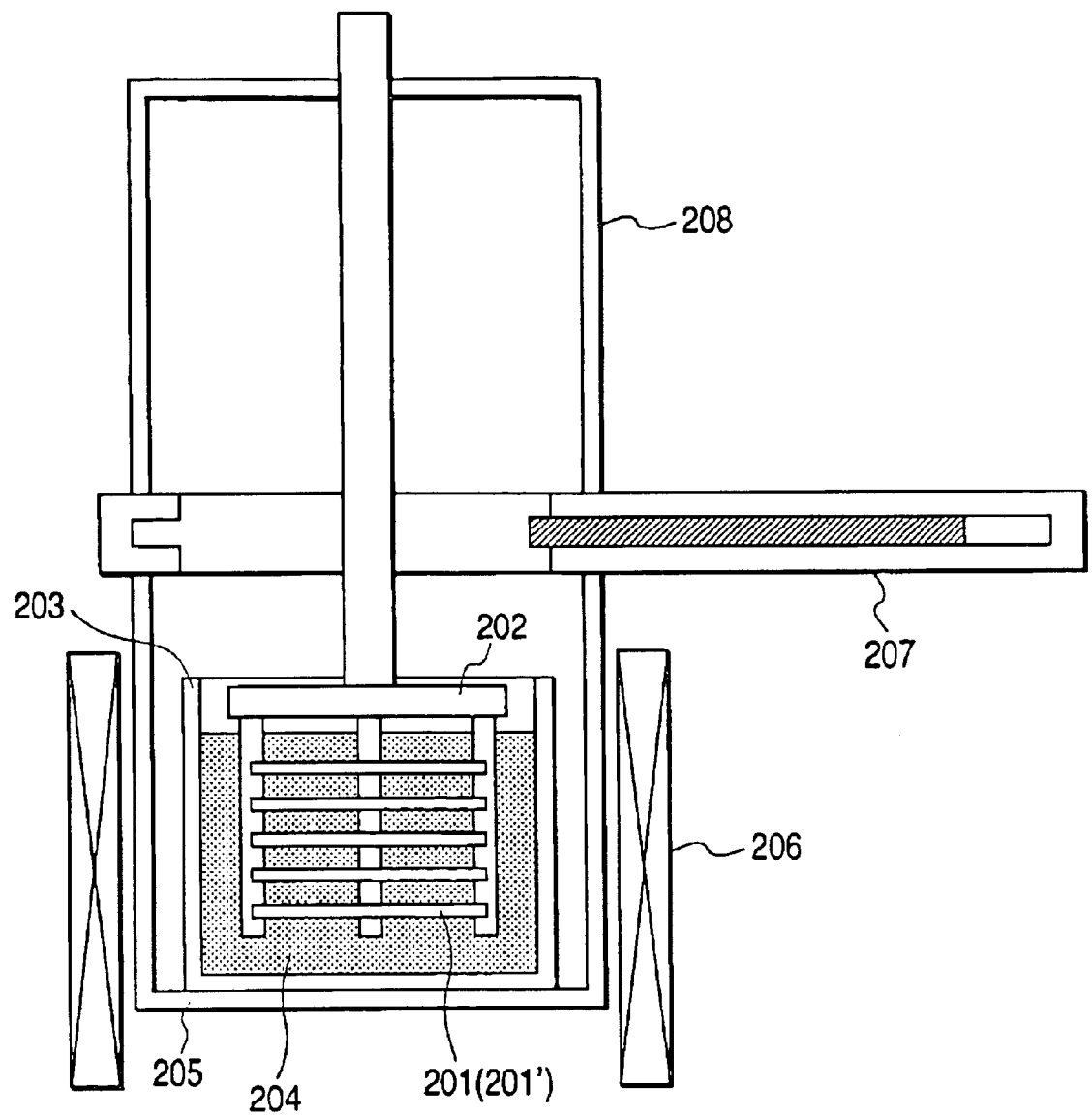
FIG. 14 is a schematic view showing an example of a conventional liquid phase growth apparatus.
Figure 15:
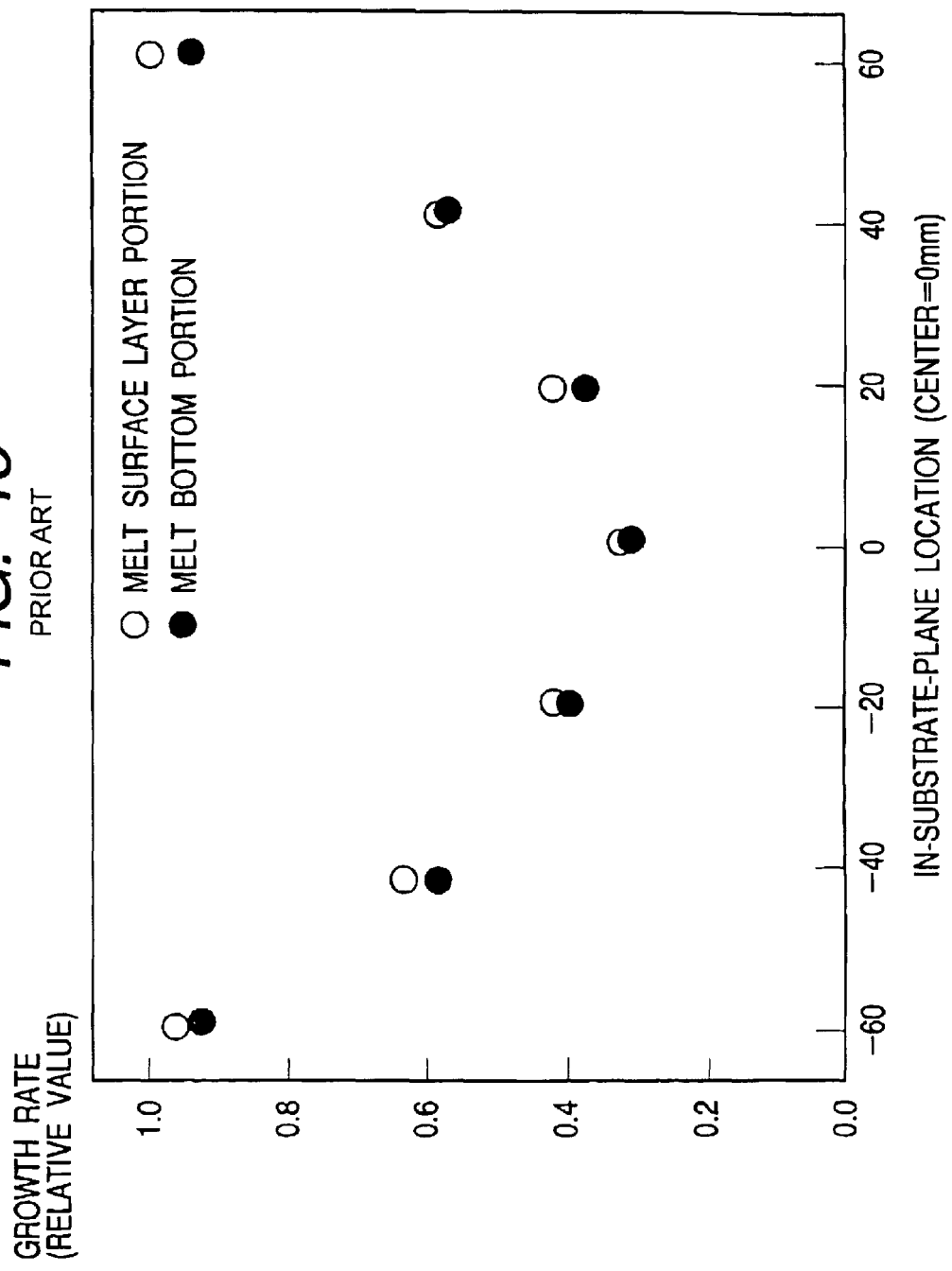
FIG. 15 is a chart showing the in-plane distribution of the growth rate in a conventional liquid phase growth apparatus.
Figure 16:
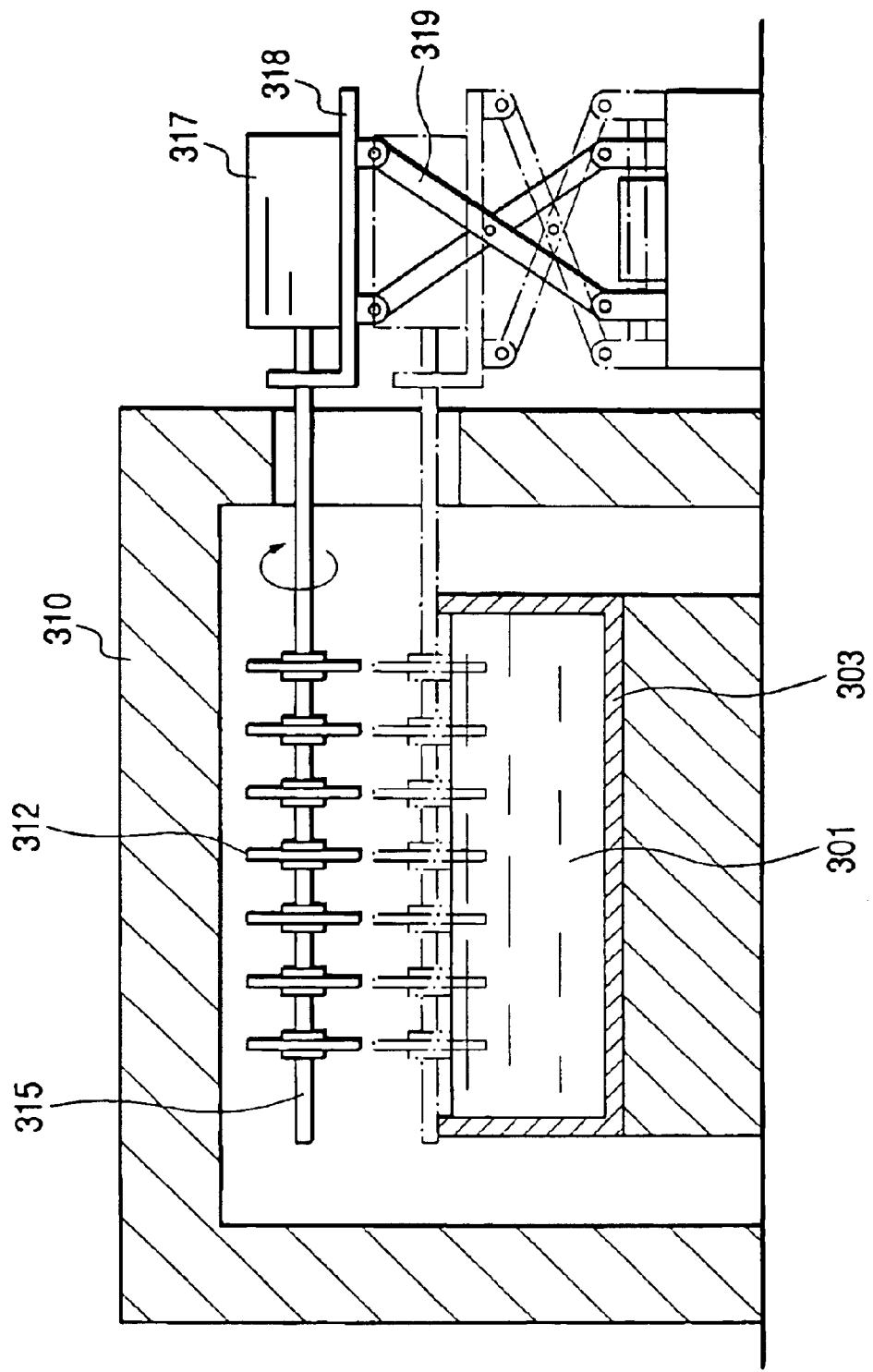
FIG. 16 is a schematic view showing another example of a conventional liquid phase growth apparatus.

Referring to FIG. 13, substrates 1101 for melting or growth each have a square shape with sides of 125 mm in length. The substrates 1101 are arranged radially in such a manner that the mutually adjacent substrates have a distance of about 10 mm at the closest position. Substrate support means 1102 holds 50 pieces of the substrates 1101 in a similar manner as in the crucible shown in FIG. 1.

A melt 1103 is housed in a crucible 1104 made of quartz glass placed on a turntable 1105. The crucible 1104 is provided with radial fins 1108 on the bottom thereof. On the outer periphery of the substrate support means 1002, a plurality of fins 1109 perpendicular to the surface of the melt 1103 are provided at locations close to the inner sidewall of the crucible 1104 radially as in the crucible shown in FIG. 1.

The above-described crucible 1104 is housed in a growth chamber 1106 made of quartz glass, which is provided with a gate valve 1110 at the upper opening thereof, thereby being capable of cutting off from the atmosphere. The temperature of the melt 1103 in the crucible 1104 is controlled by an electric heating furnace 1107.

The gate valve 1110 is opened when the substrate support means 1102 is supplied into the growth chamber 1106. The gate valve 1110 is so mounted as to be slidable backward in the direction perpendicular to the drawing of FIG. 13.

In the liquid phase growth apparatus of the present embodiment, an unrepresented growth chamber equivalent to the growth chamber 1106 is provided independently for growing the n⁺-type layer 1004. Further, independently of these chambers, there are provided a hydrogen annealing chamber 1117 for hydrogen annealing of the substrate 1101 having the porous layer (corresponding to 1002 in FIG. 12) formed thereon and a substrate exchange chamber 1118 for exchanging the substrates in the substrate support means 1102.

FIG. 13 shows a state in which the substrate support means 1102 has been moved from a load lock chamber 1112 to the interior of the growth furnace 1106 by a supporting rod 1113.

There are also provided connecting chambers 1116, 1116', 1116" for connecting gate valves 1110, 1110', 1110" of the growth chamber 1106, the hydrogen annealing chamber 1117 and the substrate exchange chamber 1118 to a gate valve 1111 of the load lock chamber 1112, and in case of transferring the substrate support means 1102 between the load lock chamber 1112 and the growth chamber 1106, the hydrogen annealing chamber 1117 or the substrate exchange chamber 1118, the substrates can be transferred without any contamination by the external atmosphere by evacuating the interior of the connecting chamber 1116, 1116' or 1116" in advance and then opening the gate valve 1110, 1110' or 1110".

In the following there will be given a detailed explanation on the process of epitaxial growth on the substrate 1101 having a porous layer (corresponding to 1002 in FIG. 12) formed thereon.

At first, with the liquid phase growth apparatus shown in FIG. 13, the substrate support means 1102 supporting the p⁻-type polycrystalline silicon substrates 1101' for melting is set at a predetermined position in the substrate exchange chamber 1118. Then, the gate valve 1110" of the substrate exchange chamber 1118 is closed, and the interior thereof is evacuated.

Then, the load lock chamber 1112, the interior of which has been evacuated, is moved to a position just above the substrate exchange chamber 1118, and, after the interior of the connecting chamber 1116" has been evacuated, the gate valve 1111 of the load lock chamber 1112 is opened. Then, the supporting rod 1113 accompanying the load lock chamber is actuated to transfer the substrate support means 1102 into the load lock chamber 1112, and, after the gate valve 1111 is closed, the load lock chamber 1112 is moved to a position just above the hydrogen annealing chamber 1117.

The interior of the load lock chamber 1112 and the connecting chamber 1116' is evacuated and then replaced with hydrogen. On the other hand, the interior of the hydrogen annealing chamber 1117 is maintained at 1050° C. and hydrogen is flown thereinto. When the internal pressures of the load lock chamber 1112, the hydrogen annealing chamber 1117 and the connecting chamber 1116" become balanced, the gate valve 1111 of the load lock chamber 1112 and the gate valve 1110' of the hydrogen annealing chamber 1117 are opened and the substrate support means 1102 is lowered and is retained at that position for 10 minutes. This operation eliminates a native oxide film present on the surface of the polycrystalline silicon 1101' for melting.

Thereafter, the substrate support means 1102 is lifted up, and the gate valve 1110' of the hydrogen annealing chamber 1117 and the gate valve 1111 of the load lock chamber 1112 are closed. Then, the interior of the connecting chamber 1116' is replaced with nitrogen and is then opened to the atmosphere, and the load lock chamber is separated.

Subsequently, the load lock chamber 1112 is moved to a position just above the growth chamber 1106. Then, after the interior of the connecting chamber 1116 has been evacuated and replaced with hydrogen, the gate valve 1111 of the load lock chamber 1112 and the gate valve 1110 of the growth chamber 1106 are opened and the substrate support means 1102 is lowered to a substrate pre-heating position 1115 in the growth chamber 1106 and heated to 955° C. At this time, the turntable 1105 starts to rotate clockwise at a speed of 6 rpm.

Then, the substrate support means 1102 is dipped in the melt 1103 maintained at 955° C. This state is maintained for 30 minutes to melt silicon in the melt 1103. Thereafter, the polycrystalline silicon 1101' and the substrate support means 1102 are recovered from the substrate exchange chamber 1118 through a predetermined procedure.

In the meantime, another substrate support means mounted with polycrystalline silicon substrates for melting $n^+$-type silicon is set in the substrate exchange chamber 1118, and silicon and a dopant are melted in the melt in the unrepresented $n^+$-type silicon growth chamber by a similar procedure. The amount of silicon consumed in a single growth is much smaller in $n^+$-type than in $p^-$-type, so that the melting is terminated within a shorter period of time.

Then, still another substrate support means 1102', mounted with $p^+$-type monocrystalline silicon substrates 1101 having a face orientation of (111) and having a porous layer (corresponding to 1002 in FIG. 12) formed on the surface, is set in the substrate exchange chamber 1118. As in the melting procedure, hydrogen annealing is executed at first in the hydrogen annealing chamber 1117.

Subsequently, a $p^-$-type layer (corresponding to 1003 in FIG. 12) is grown in the growth chamber 1106. In this operation, after the substrates have been heated to the temperature of 955° C. at the substrate pre-heating position 1115, the melt 1103 is cooled at a cooling rate of $-1°$ C./min. When the melt 1103 reaches the temperature of 950° C., the substrates are dipped in the melt 1103 to effect growth for 30 minutes. During the operation, the turntable 1105 carries out clockwise and counterclockwise rotations alternately for every 3 minutes at a speed of 6 rpm.

Thereafter, the substrate support means 1102' is lifted up, then transferred by use of the load lock chamber 1112 to a position above the unrepresented $n^+$-type layer growth chamber and subjected to the growth of the $n^+$-type layer (corresponding to 1004 in FIG. 12) therein. In this operation, the melt is cooled at a cooling rate of $-0.5°$ C./min from the temperature of 855° C., and the substrates 1001 are dipped in the melt 1103 when they reach the temperature of 850° C. to start the crystal growth, which is terminated after 3 minutes.

On the other hand, during the growth of the $n^+$-type layer (corresponding to 1004 in FIG. 12), silicon melting is started in the growth chamber 1106 for the subsequent $p^-$-type layer growth to prepare for the next time growth operation.

For the thus grown substrates, the total thickness of the $p^-$-type layer 1003 and the $n^+$-type layer 1004 was evaluated by the sectional observation with a SEM (scanning electron microscope), and the thickness of the $n^+$-type layer 1004 was determined with an SIMS (secondary ion mass spectrometry). As a result, the difference in thickness between the center of the substrate and a position which was 5 mm inside from the periphery of the substrate was within ±10% for the $p^-$-type layer 1003 and within ±5% for the $n^+$-type layer 1004. Further, the solar cells produced by the method shown in FIG. 12 showed a very satisfactory distribution of the conversion efficiency within ±1%. Further, the liquid phase growth apparatus of the present embodiment can avoid unnecessary contamination by the atmosphere since the substrates can be transferred between the annealing chamber and the growth chamber in a state isolated from the atmosphere.

(Embodiment 5)

Figure 17A:
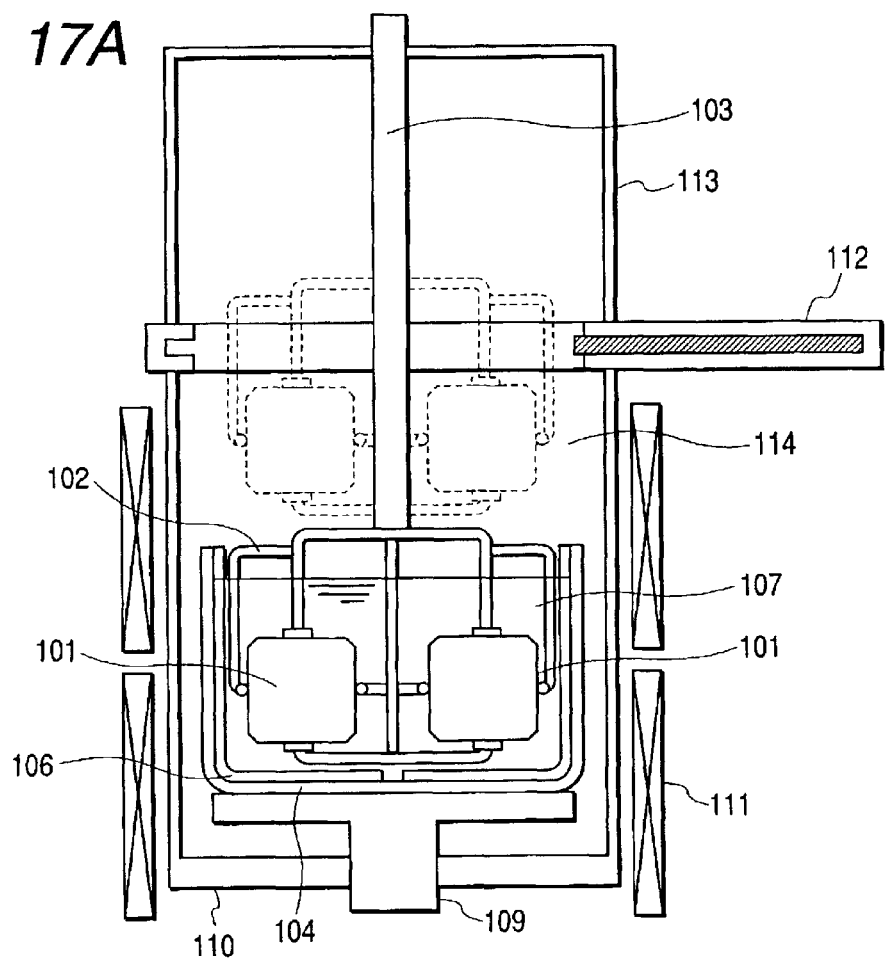
FIGS. 17A and 17B are sectional views showing the schematic configuration of the liquid phase growth apparatus of a fifth embodiment of the present invention.
Figure 17B:
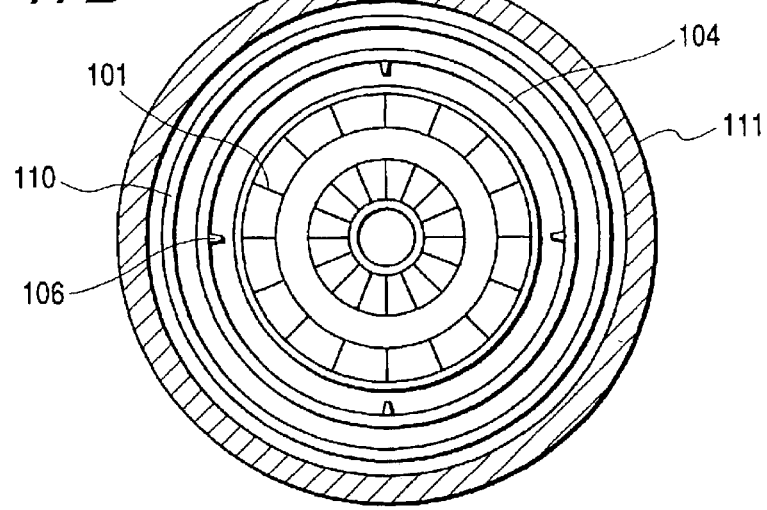
Figure 18:
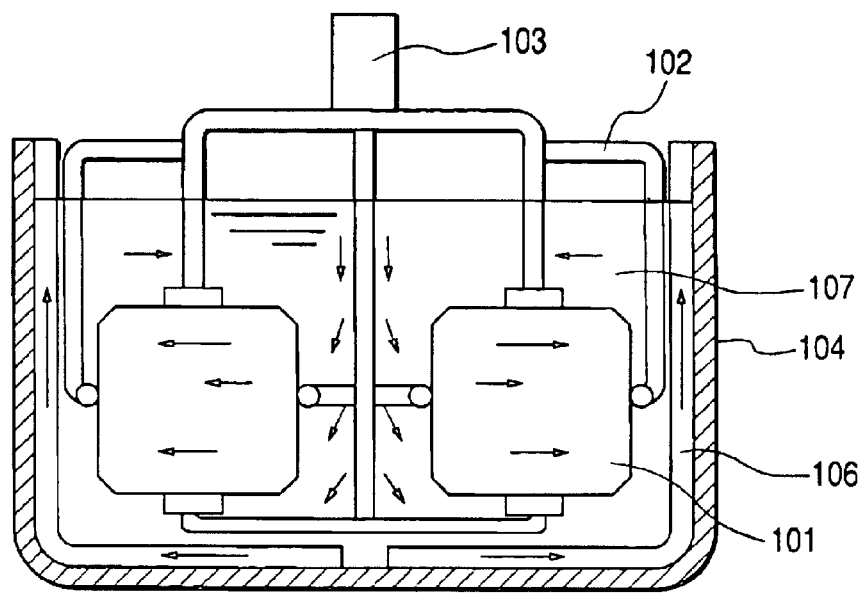
FIG. 18 is an enlarged view of the crucible 104 shown in FIGS. 17A and 17B.
Figure 19:
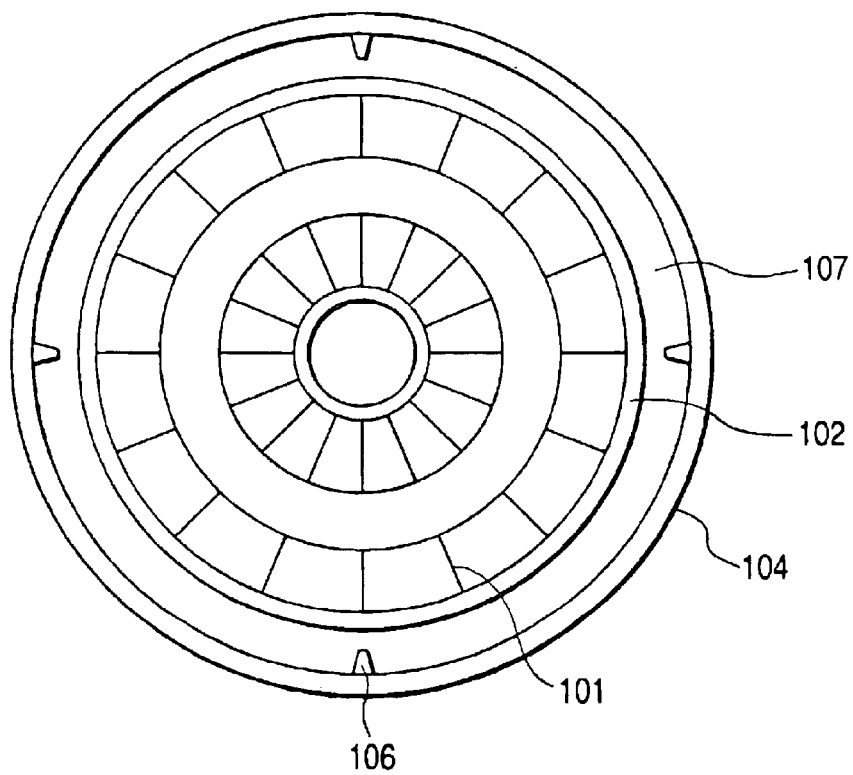
FIG. 19 is a plan view of the crucible shown in FIG. 18.

FIGS. 17A and 17B are schematic sectional view showing the configuration of a liquid phase growth apparatus of Embodiment 5 of the present invention, while FIG. 18 is an enlarged view of a crucible 104 shown in FIGS. 17A and 17B, and FIG. 19 is a plan view of the crucible shown in FIG. 18.

Referring to FIGS. 17A to 19, there are shown monocrystalline silicon substrates 101 of a square plate shape with sides of about 125 mm in length and with cut-off corners, substrate support means 102 for supporting the substrates 101, a melt 107 in which silicon to be grown on the substrates 101 is melted, a crucible 104 housing the melt 107, ribs 106 provided on the side and bottom faces of the crucible 104, a crucible turntable 109 capable of being rotated by an unrepresented rotation drive mechanism, a substrate support means supporting rod 103 for supporting the substrate support means which holds the substrates 101 that is capable of vertical and rotational movements, a growth furnace 110, a heating means 111 for heating the crucible 104 housing the melt 107 from the outside of the growth furnace 110, and a load lock chamber 113 to be used for supplying the substrates 101 supported by the substrate support means 102 into the growth furnace 110.

Further, the growth furnace 110 is provided with a gate valve 112 for opening and closing and is therefore capable of maintaining the crucible 104 and the substrate 101 in vacuum atmosphere, hydrogen atmosphere or nitrogen atmosphere.

With respect to the arrangement of the substrates 101, for example, 16 pieces of the substrates 101 are supported by the substrate support means 102 so as to be arranged perpendicularly to the surface of the melt 107 and radially when viewed from above. The mutually adjacent substrates 101 form an angle of about 22.5° and have a distance of about 17 mm at the closest position.

In the following there will be explained the operations of the liquid phase growth apparatus shown in FIGS. 17A and 17B. At first, from the state shown in FIGS. 17A and 17B, the substrate support means 102 is lifted up by the lifting of the substrate support means supporting rod 103, and after the gate valve 112 has been closed, the load lock chamber 113 is transferred from the position above the gate valve 112 to an unrepresented substrate exchange position.

Then, the substrate support means 102 is lowered by the lowering of the supporting rod 103 from the load lock chamber 113, and the substrates 101 supported by the substrate support means 102 are replaced by p-type polycrystalline silicon wafers of a square plate shape with sides of 125 mm in length for silicon melting, and the substrate support means 103 is returned by the lifting of the supporting rod 103 to the load lock chamber 113.

On the other hand, the growth furnace 110 is heated to the temperature of about 900° C. by the electric heating furnace 111 while flowing hydrogen thereinto. In this state, the load lock chamber 113 is returned to a position above the gate valve 112 and is brought into close contact with the gate valve 112.

Then, the interior of the load lock chamber 113 is once evacuated and is then replaced with hydrogen, and the gate valve 112 is opened. Subsequently the substrate support means 102 is gradually lowered to dip the polycrystalline silicon wafers into the melt 107.

In the meantime, the substrate support means 102 is rotated for example clockwise when viewed from above at a speed of 6 rpm, while the turntable 109 is rotated counterclockwise at a speed of 6 rpm to rotate the crucible 104, whereby the melt 107 is agitated to flow in a direction as indicated by arrows 108 in FIG. 2.

The agitation is continued for about 30 minutes to melt silicon in the melt 107 so as to attain supersaturation.

Thereafter, the gate valve 112 is opened, then the substrate support means 102 is lifted up from the melt 107 and transferred into the load lock chamber 113 and the gate valve 112 is closed.

Subsequently, the interior of the load lock chamber is replaced with nitrogen gas, and the polycrystalline silicon wafers are replaced with the substrates 101 at the substrate exchange position.

Then, the load lock chamber 113 is transferred to a position above the gate valve 112 and is brought into close contact with the gate valve 112, and after the interior of the load lock chamber 113 has been evacuated and replaced with hydrogen, the gate valve 112 is opened.

Subsequently, the substrate support means 102 is gradually lowered to an intermediate position 114 and heated to about 900° C. Then, the melt 107 starts to be cooled at a cooling rate of about −1° C./min.

When the melt 107 reaches for example 895° C., the substrate support means 102 is further lowered to dip the wafers 101 in the melt 107 as supersaturated with silicon, and the cooling of the melt 107 is further continued.

After the continued respective rotations of the substrate support means 102 and the crucible 104 for 30 minutes, the substrate support means 102 is lifted up to the intermediate position 114 and is maintained at the position for about 1 minute for removing the melt 107 remaining on the wafers 101, and is then further lifted up to the interior of the load lock chamber 113, whereupon the gate valve 112 is closed.

The load lock chamber 113, after replacement of the interior thereof with nitrogen, is transferred to the unrepresented substrate exchange position, at which the substrates are taken off. The substrates 101 each had a silicon layer epitaxially grown thereon, the thicknesses of which were measured with a micrometer, with the result that for the difference in thickness between the substrates, the distribution was 30 μm±10% for in-plane average value among 20 substrates and the distribution in each substrate was 10% in an area other than an area within 5 mm from the edge.

Figure 22:
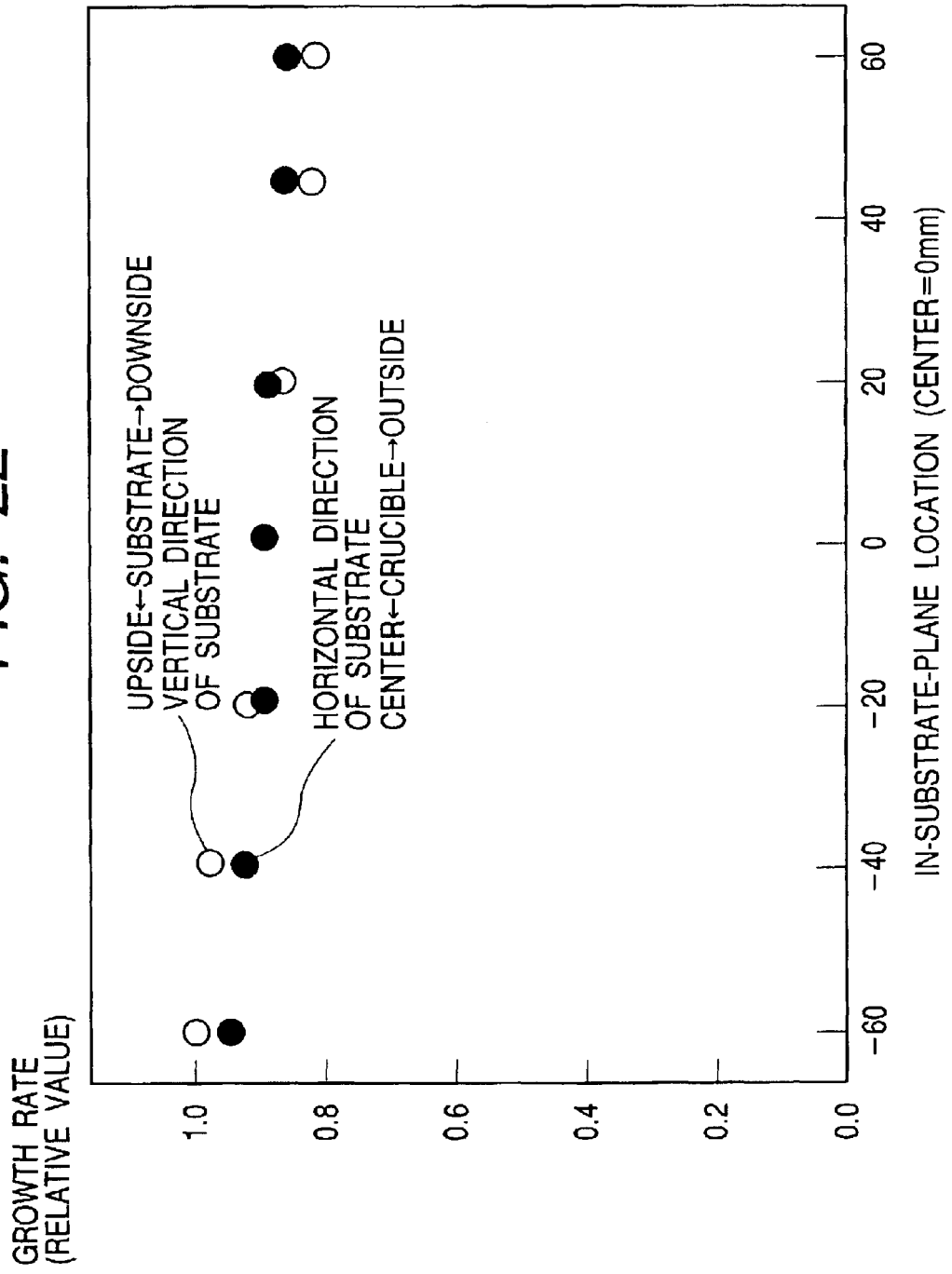
FIG. 22 is a chart showing the in-plane distribution of the growth rate in the case of liquid phase growth of silicon on the substrate 101 by the liquid phase growth apparatus shown in FIGS. 17A and 17B.

FIG. 22 is a chart showing the in-plane distribution of the growth rate in case of liquid phase growth of silicon on the substrates 101 with the liquid phase growth apparatus shown in FIGS. 17A and 17B, wherein "○" indicates the growth rates at the central portion of the substrate, measured at equal intervals of 20 mm in the vertical direction, while "•" indicates the growth rates at the central portion of the substrate, measured at equal intervals of 20 mm in the horizontal direction.

As is seen from FIG. 22, the growth rate did not vary in both the vertical and the horizontal directions at the central portion of each substrate 101. Stated differently, the growth rate was substantially uniform over the entire surface of the substrates 101.

Figure 20:
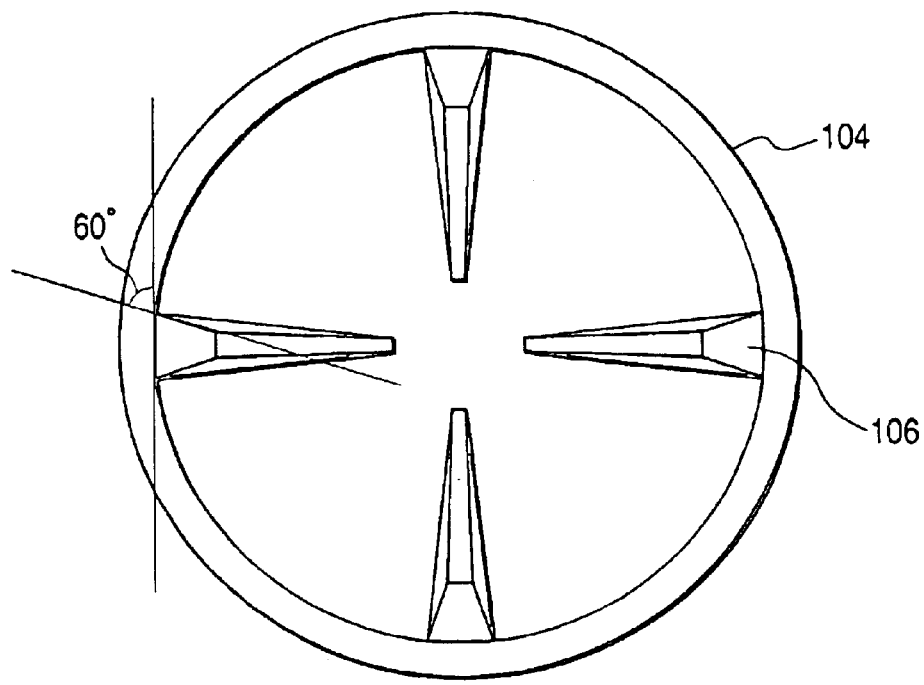
FIG. 20 is a plan view of the crucible 104 shown in FIGS. 17A and 17B.
Figure 21:
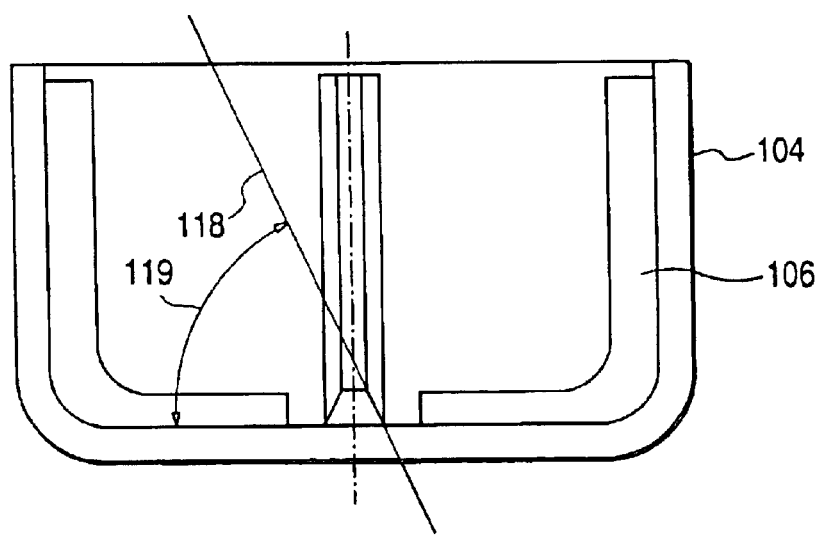
FIG. 21 is a vertical sectional view of the crucible shown in FIG. 20.

FIG. 20 is a plan view of the crucible 104, and FIG. 21 is a vertical sectional view thereof. The ribs 106 become thinner toward the center of the crucible 104. Each rib 106 is so formed as to have an angle 119 of about 60° between the side face 118 and the bottom face thereof. Further, the side face which faces the center of the crucible 104 of each rib 106 is inclined outside at an angle of, for example, about 1° with regard to the vertical direction. The inner sidewall of the crucible 104 is also inclined outside at an angle of, for example, about 1° with regard to the vertical direction so as to slightly increase the inner diameter of the crucible 104 upwardly.

The melt 104 is to be exchanged in a cooled and solidified state, and will shrink after solidification according to the linear expansion coefficient. The outside inclination of the crucible-center-side side face of the rib 106 mentioned above facilitates the exchange of the solidified melt 104.

When the melt 104 is solidified and shrinks, a larger stress is generated in the ribs 106 as the angle between the side face and the bottom face thereof approaches a right angle. On the other hand, the agitating effect for the melt 104 decreases as the angle between the side face and the bottom face thereof approaches 0°. Therefore, the angle between the side face and the bottom face thereof is preferably 60° as explained in the foregoing, though it is variable depending on the crystal raw material contained in the melt 104.

Further, in the present embodiment, there has been explained a configuration in which for example 16 pieces of the substrates 101 are supported perpendicularly to the surface of the melt 107 and radially when viewed from above the crucible, but there may also be adopted a configuration in which a plurality of the substrates 101 are arranged linearly and are moved in the plane direction thereof.

The phrase "plane direction of a substrate" as used herein to specify the direction of moving the substrate includes any directions that are not parallel to the surface (principal surface) of the substrate, including not only a direction perpendicular to the substrate surface but also any directions that form any angle to the substrate surface. However, in order to obtain sufficient melt (or solution) agitating effect by the movement of the substrate, the plane direction is preferably selected from those directions which form an angle of 60–90° to the substrate surface.

(Embodiment 6)

Figure 23:
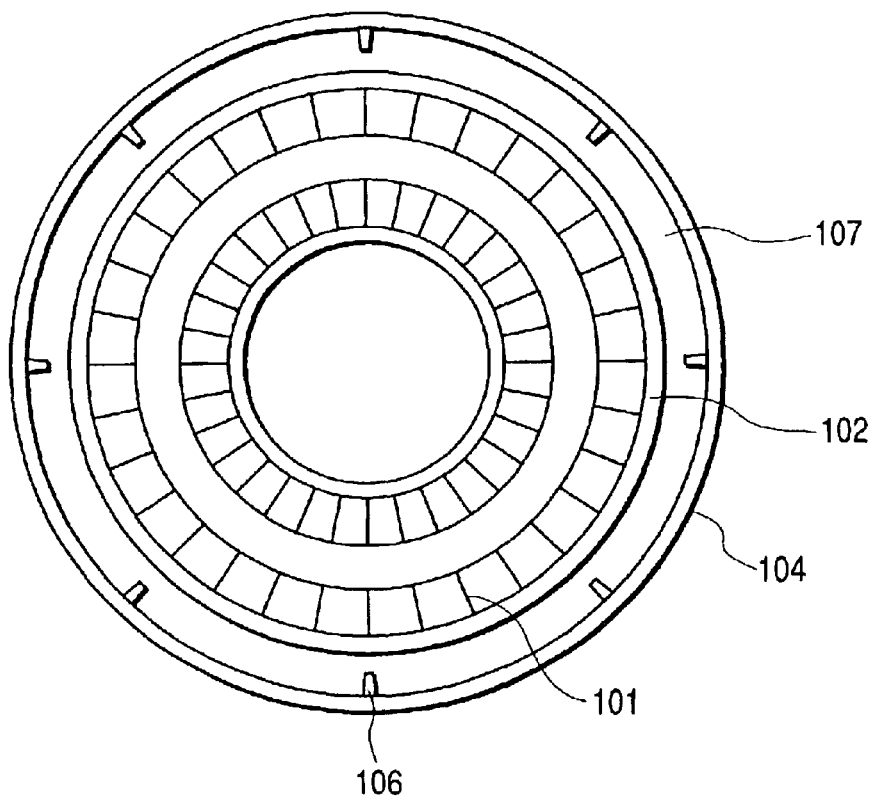
FIG. 23 is a plan view of a crucible 104 of a sixth embodiment of the present invention.
Figure 24:
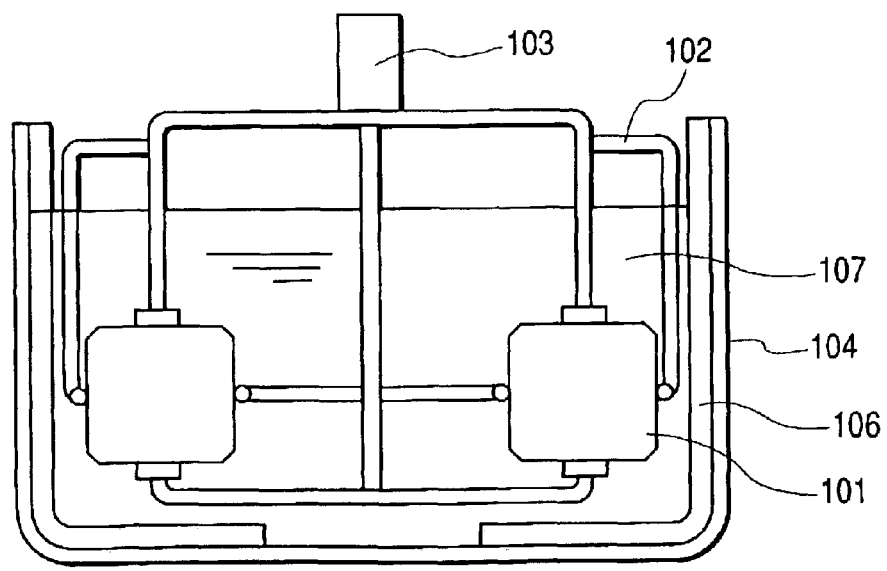
FIG. 24 is a vertical sectional view of the crucible shown in FIG. 23.

FIGS. 23 and 24 are respectively a sectional view and a plan view of a crucible 104 of Embodiment 6 of the present invention, and respectively correspond to FIGS. 18 and 19 of Embodiment 5. For clarity, the same numerals are employed in FIGS. 23 and 24 as are employed in FIGS. 18 and 19 for equivalent components.

In the present embodiment, the crucible 104 is larger than in Embodiment 5 so as to hold a larger number of the substrates 101. The substrates 101 are supported by the substrate support means 102, as in Embodiment 5, perpendicularly to the surface of the melt 107 and radially when viewed from above the crucible 104. In the present embodiment, there are provided 32 pieces of the substrates 101.

The mutually adjacent substrates 101 form an angle of about 11.25°, and has a distance of about 23 mm in the closest position.

In comparison with Embodiment 5, the present embodiment employs a larger number of the ribs 106 and a larger amount of the melt 107. The amount of the melt 107 is increased, in consideration of the increase in the number of the substrates 101, in order to secure a flow path of the melt for returning to the center of the crucible 104 after passing through the gaps between the adjacent substrates 101 and flowing to the external portion inside the crucible 104.

The above-described apparatus was employed in epitaxial growth of silicon on the substrates 101 in a procedure similar to that in Embodiment 5, and the thicknesses of the silicon layers measured with a micrometer showed a distribution of 30 μm±9% as the in-plane average value for the 32 substrates and a distribution of ±9% for an area other than an area within 5 mm from the edge in each substrate.

(Embodiment 7)

Figure 25:
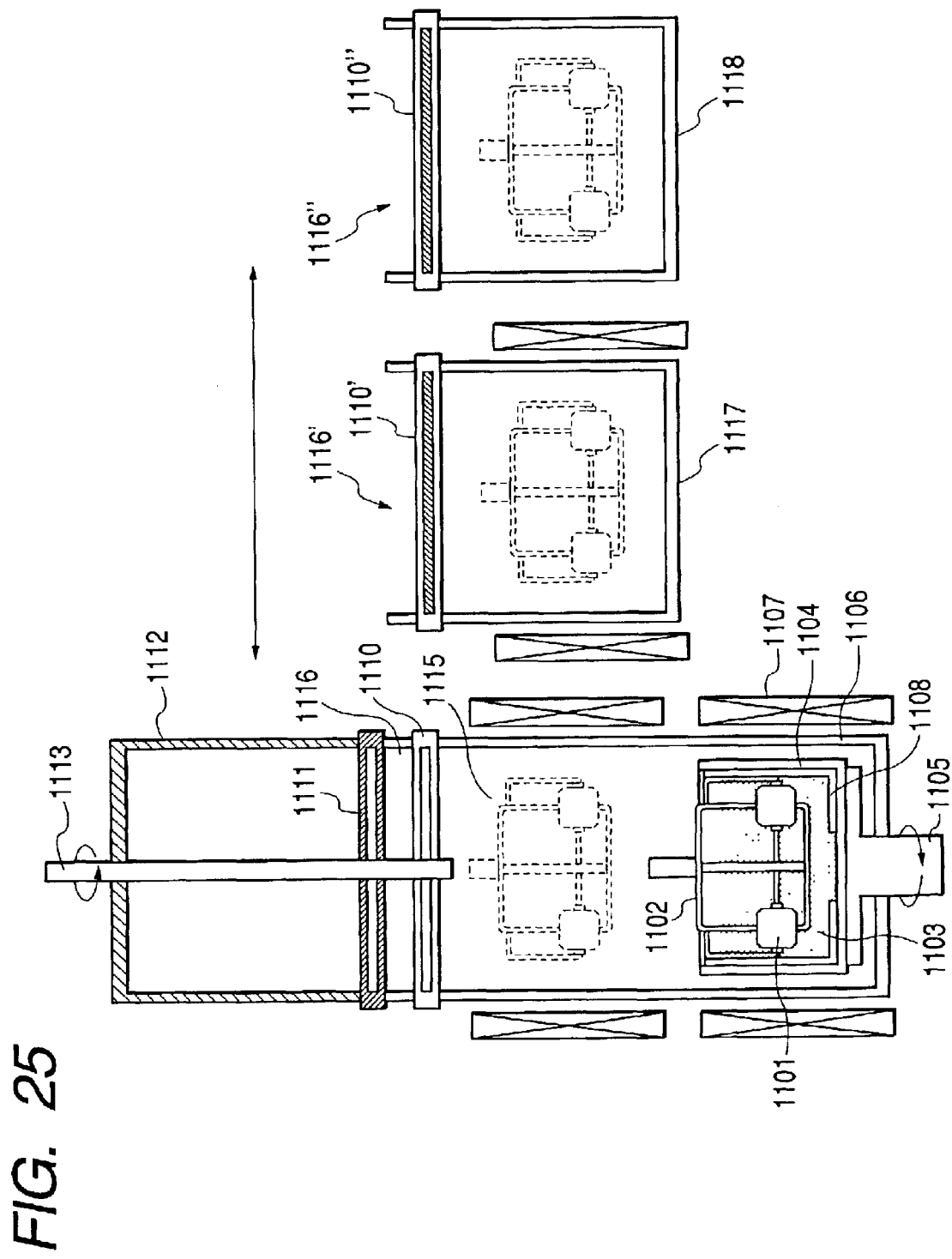
FIG. 25 is a schematic view showing the configuration of a liquid phase growth apparatus of a seventh embodiment of the present invention.

FIG. 25 is a schematic view of a liquid phase growth apparatus of Embodiment 7 of the present invention, which is different from the apparatus shown in FIG. 13 in that the ribs 1108 of a different shape are provided instead of the fins 1108 and fins 1109. Referring to FIG. 25, each $p^+$-type silicon wafer 1101 has a square shape with sides of about 125 mm in length. Substrate support means 1102 holds 50 pieces of the $p^+$-silicon wafers 1101 at a distance of 1 cm at the closest position.

There are also shown a melt 1103 housed in a crucible 1104 made of quartz glass as placed on a turntable 1105, a growth furnace 1106 made of quartz glass, a gate valve 1110 provided in the upper part of the growth furnace 1106 for isolation from the atmosphere, and an electric furnace 1107 for controlling the temperature of the melt 1103.

The gate valve 1110 is opened when the substrate support means 1102 enters the growth furnace 1106. The gate valve 1110 is so mounted as to be slidable to the backside of the drawing in the figure.

In the apparatus of the present embodiment, an unrepresented growth furnace equivalent to the growth furnace 1106 is provided independently of the growth furnace 1106, for growing a layer corresponding to the $n^+$-type layer 1004 shown in FIG. 12.

Further, there are provided a hydrogen annealing chamber 1117 for hydrogen annealing of the $p^+$-type silicon wafers 1101 having the porous layer 1002 formed thereon and a substrate exchange chamber 1118 for exchanging the $p^+$-type silicon wavers and the substrates for melting.

FIG. 25 shows a state in which the substrate support means 1102 has been transferred to the interior of the growth furnace 1106 by a supporting rod 1113.

There are also provided connecting chambers 1116, 1116', 1116" for connecting gate valves 1110, 1110', 1110" of the growth furnace 1106, the hydrogen annealing chamber 1117 and the substrate exchange chamber 1118 to a gate valve 1111 of the load lock chamber 1112.

In case of transferring the substrate support means 1102 between the load lock chamber 1112 and the growth furnace 1106 or the hydrogen annealing chamber 1117, the $p^+$-type silicon wafers 1101 can be transferred without any contamination by the atmosphere by evacuating the interior of the connecting chamber 1116, 1116' or 1116" in advance and then opening the gate valve 1110, 1110' or 1110".

In the following there will be explained the process of epitaxial growth on the $p^+$-type silicon wafers 1101 having the porous layer 1002 formed thereon.

At first, the substrate support means 1102 supporting the $p^-$-type polycrystalline silicon substrates 1101' for melting in place of the $p^+$-type silicon wafers 1101 is set at a predetermined position in the substrate exchange chamber 1118.

Then, the gate valve 1110" of the substrate exchange chamber 1118 is closed, and the interior thereof is evacuated. The load lock chamber 1112, the interior of which has been evacuated, is moved to a position just above the substrate exchange chamber 1118, and after the interior of the connecting chamber 1116" has been evacuated, the gate valve 1111 of the load lock chamber 1112 is opened.

Then, the supporting rod 1113 associated with the load lock chamber is actuated to transfer the substrate support means 1102 into the load lock chamber 1112, and after the gate valve 1111 has been closed, the load lock chamber 1112 is moved to a position just above the hydrogen annealing chamber 1117.

The interior of the load lock chamber 1112 and the connecting chamber 1116' is evacuated and then replaced with hydrogen. On the other hand, the interior of the hydrogen annealing chamber 1117 is maintained at 1050° C. while flowing hydrogen therein.

When the internal pressures of the load lock chamber 1112, hydrogen annealing chamber 1117 and connecting chamber 1116" become balanced, the gate valve 1111 of the load lock chamber 1112 and the gate valve 1110' of the hydrogen annealing chamber 1117 are opened and the substrate support means 1102 is lowered and retained at the position for about 10 minutes.

This operation eliminates native oxide films present on the surfaces of the polycrystalline silicon substrates 1101' for melting. Thereafter, the substrate support means 1102 is lifted up, and the gate valve 1110' of the hydrogen annealing chamber 1117 and the gate valve 1111 of the load lock chamber 1112 are closed.

Then, the interior of the connecting chamber 1116' is replaced with nitrogen and is then opened to the atmosphere, and the load lock chamber 1112 is separated off. Subsequently, the load lock chamber 1112 is moved to a position just above the growth chamber 1106.

Then, after the interior of the connecting chamber 1116 has been evacuated and replaced with hydrogen, the gate valve 1111 of the load lock chamber 1112 and the gate valve 1110 of the growth chamber 1106 are opened and the substrate support means 1102 is lowered to a substrate pre-heating position 1115 in the growth chamber 1106 and heated to about 955° C., and is dipped in the melt 1103 maintained at 955° C.

This state is maintained for 30 minutes while rotating the substrate support means 1102 at 10 rpm and the turntable 1105 at a speed of 6 rpm in a direction opposite to that of the substrate support means 1102 thereby melting silicon in the melt 1103.

Thereafter, the substrate support means 1102 is conveyed to the substrate exchange chamber 1118 and the polycrystalline silicon substrates for melting are taken off.

In the meantime, another substrate support means mounted with polycrystalline silicon substrates for melting $n^+$-type silicon is set in the substrate exchange chamber 1118, and silicon and a dopant are melted in the melt in the unrepresented $n^+$-type silicon growth chamber by a procedure similar to that described above.

The amount of silicon consumed in a single growth is much smaller in $n^+$-type than in $p^-$-type, so that the melting is terminated within a shorter period of time.

Then, still another substrate support means 1102' mounted with $p^+$-type monocrystalline silicon wafers 1101 of a face orientation of (111) having the porous layer 1002 formed thereon is set in the substrate exchange chamber 1118.

As in the melting procedure of silicon into the melt 1103, hydrogen annealing is carried out at first in the hydrogen annealing chamber 1117. Subsequently, the $p^-$-type layer 1003 is grown in the growth furnace. In this operation, after the substrates have been heated to about 955° C. in the intermediate position 1115, the melt 1103 is cooled at a cooling rate of –1° C./min.

When the melt 1103 reaches 950° C., the $p^+$-silicon wafers 1101 are dipped in the melt 1103 to effect growth for about 30 minutes. In the meantime, the substrate support means 1102' is rotated at a speed of 5 rpm, while the turntable 1105 is simultaneously rotated in a direction opposite to that of the substrate support means 1102'.

Thereafter, the substrate support means 1102' is lifted up from the melt 1103, then transferred by the load lock chamber 1112 to a position above the unrepresented $n^+$-layer growth furnace and subjected to the growth of the $n^+$-layer 1004 therein. In this operation, the melt 1103 is cooled with a cooling rate of −0.5° C./min from 855° C., and the p⁺-type silicon wafers 1101 are dipped in the melt 1103 when it reaches 850° C. to start the crystal growth, which is terminated after 3 minutes.

On the other hand, during the growth of the n⁺-type layer 1004, the silicon melting is started in the p⁻-type layer growth furnace 1106 thereby preparing for the next time growth operation.

After these growing operations, the cross sections of the p⁺-type silicon wafers 1101 having the silicon layers grown thereon were evaluated by observation with an SEM (scanning electron microscope), and the thickness of the n⁺-type layer 1004 was measured with an SIMS (secondary ion mass spectrometry). As a result, the difference in thickness between the center and a position which is 5 mm inside from the periphery of the p⁺-type silicon wafer 1101 was within ±10% for the p⁻-type layer 1003 and within ±5% for the n⁺-type layer 1004.

Further, solar cells produced by the process similar to that of Embodiment 4 (process shown in FIG. 12) using the thus obtained silicon wafers 1101 showed a very satisfactory distribution of the conversion efficiencies of ±1%. Further, the liquid phase growth apparatus of the present embodiment can avoid unnecessary contamination from the atmosphere since the substrates can be transferred between the annealing chamber and the growth chamber in a state isolated from the atmosphere.

In the foregoing embodiments, there has been exclusively explained growth of silicon, but such embodiments are not restrictive and the liquid phase growth method and the liquid phase growth apparatus of the present invention are naturally applicable not only to silicon semiconductors but also to the liquid phase growth of other crystalline materials.

As described in detail above, the preferred embodiments of the present invention enable liquid phase growth of crystals of a uniform thickness on a plurality of substrates.

Consequently, there can be provided a liquid phase growth method capable of achieving a high growth rate and showing a small difference in the growth rate among substrates or within the same substrate even when a large number of substrates are charged in one batch, and a liquid phase growth apparatus suitable for carrying out the liquid phase growth method.

What is claimed is:

1. A liquid phase growth method comprising:
   dipping a substrate in a solution housed in a vessel and containing a crystal raw material; and
   liquid-phase growing the material on the substrate while moving the substrate in a plane direction thereof in a dipped state to agitate the solution.

2. The method according to claim 1, wherein the vessel is moved in a direction opposite to the moving direction of the substrate.

3. The method according to claim 1, wherein a plurality of substrates are arranged radially and are rotated to agitate the solution.

4. A liquid phase growth method comprising:
   dipping a seed substrate in a solution in a vessel having a crystal raw material melted therein; and
   growing a crystal on the seed substrate,
   wherein a first fin is provided on a bottom of the vessel, for regulating a flow of the solution from a central portion outside in a radial direction in the vessel,
   wherein a second fin is provided on an inner sidewall of the vessel, for regulating a flow of the solution from the bottom upwardly, and
   wherein the vessel is rotated while regulating a flow of the solution by an action of the first and the second fins to bring the solution into contact with the seed substrate.

5. The method according to claim 4, wherein the crystal is grown on the substrate while moving the substrate in a plane direction thereof to agitate the solution.

6. The method according to claim 5, wherein the vessel is moved in a direction opposite to the moving direction of the substrate.

7. The method according to claim 5 or 6, wherein a plurality of the substrates are arranged radially and are rotated to agitate the solution.

8. A liquid phase growth method comprising:
   dipping a seed substrate in a solution in a vessel having a crystal raw material melted therein; and
   growing a crystal on the seed substrate,
   wherein a fin is provided on a bottom of the vessel, for regulating a flow of the solution from a central portion outside in a radial direction in the vessel,
   wherein a flow-regulating plate is provided in the vicinity of an inner sidewall of the vessel, for regulating a flow of the solution from the bottom upwardly, and
   wherein the vessel is rotated while regulating a flow of the solution by an action of the fin and the flow-regulating plate to bring the solution into contact with the seed substrate.

9. The method according to claim 8, wherein a plurality of the seed substrates are held perpendicularly to a surface of the solution and are arranged, as viewed from above, radially from a central portion outside in a radial direction in the vessel and equidistantly in a circumferential direction of the vessel.

10. The method according to claim 8, wherein the plurality of the seed substrates are encircled with a cylindrical member, and a plurality of the flow-regulating plates are provided on an outer peripheral surface of the cylindrical member.

11. The method according to claim 10, wherein a cylindrical member is provided at a central portion of the vessel.

12. The method according to claim 8, wherein the vessel is rotated in a circumferential direction thereof, alternately in forward and backward directions.

13. A liquid phase growth apparatus comprising:
   a vessel housing a solution containing a crystal raw material;
   dipping means for dipping a substrate in the solution; and
   moving means for moving the substrate in a plane direction thereof in a state in which the substrate is dipped in the solution by the dipping means.

14. The apparatus according to claim 13, further comprising means for moving the vessel in a direction opposite to the moving direction of the substrate.

15. The apparatus according to claim 13, further comprising substrate support means for supporting a plurality of the substrates radially, wherein the substrate support means is rotated to agitate the solution.

16. The apparatus according to claim 13, wherein a rib is provided on an inner face of the vessel and the thickness of the rib decreases in a direction in which the solution as solidified is taken out.

17. The apparatus according to claim 16, wherein the ribs are provided on the side face and the bottom face of the vessel.

18. A liquid phase growth apparatus comprising:
   a vessel for housing a solution having a crystal raw material melted therein; and substrate support means for supporting and dipping a seed substrate in the solution, wherein a first fin is provided on a bottom of the vessel radially in a radial direction thereof and a second fin is provided on an inner sidewall of the vessel.

19. The apparatus according to claim 18, wherein the vessel is provided with rotating means.

20. The apparatus according to claim 18 or 19, wherein the substrate support means is for supporting a plurality of the substrates radially and is provided with rotating means.

21. The apparatus according to claim 18 or 19, wherein a flow-regulating plate is provided in the vicinity of an inner sidewall of the vessel perpendicularly to a surface of the solution.

22. A liquid phase growth apparatus comprising:

a vessel for housing a solution having a crystal raw material melted therein; and substrate support means for supporting and dipping a seed substrate in the solution, wherein a flow-regulating plate is provided in the vicinity of an inner sidewall of the vessel perpendicularly to a surface of the solution.

23. A liquid phase growth apparatus comprising:

a vessel for housing a solution having a crystal raw material melted therein; and substrate support means for supporting and dipping a seed substrate in the solution, wherein a fin is provided on a bottom of the vessel radially in a radial direction thereof, wherein a flow-regulating plate is provided in the vicinity of an inner sidewall of the vessel perpendicularly to a surface of the solution, and wherein the vessel is provided with rotating means.

24. The apparatus according to claim 23, wherein a plurality of the seed substrates are supported by the substrate support means perpendicularly to the surface of the solution, and the plurality of seed substrates, as viewed from above, are arranged radially from a central portion outside in a radial direction in the vessel and equidistantly in a circumferential direction of the vessel.

25. The apparatus according to claim 23, wherein a first cylindrical member is provided in the vessel so as to encircle the plurality of the seed substrates, and the flow-regulating plate is provided vertically on an outer peripheral surface of the first cylindrical member.

26. The apparatus according to claim 25, wherein a second cylindrical member is provided at a central portion of the vessel such that the plurality of the seed substrates are positioned surrounding the second cylindrical member.

27. The apparatus according to claim 23, wherein an angle formed by a side face of the fin provided on the bottom of the vessel and the bottom face of the vessel becomes a larger obtuse angle toward the outside in the radial direction.

* * * * *

UNITED STATES PATENT AND TRADEMARK OFFICE
CERTIFICATE OF CORRECTION

PATENT NO. : 6,824,609 B2
DATED : November 30, 2004
INVENTOR(S) : Saito et al.

It is certified that error appears in the above-identified patent and that said Letters Patent is hereby corrected as shown below:

Title page,
Item [56], References Cited, FOREIGN PATENT DOCUMENTS, "EP 1 201 798 A1 5/2002" should read -- EP 1 201 793 A1 5/2002 --. "JP 5-3309779 12/1993" should read -- JP 5-330979 12/1993 --.

Column 21,
Line 55, "of substrates" should read -- of the substrates --.

Signed and Sealed this

Nineteenth Day of July, 2005

JON W. DUDAS
*Director of the United States Patent and Trademark Office*